United States Patent
Tsuchida et al.

(10) Patent No.: US 6,545,513 B2
(45) Date of Patent: Apr. 8, 2003

(54) ELECTRIC LOAD DRIVE APPARATUS

(75) Inventors: Masahiro Tsuchida, Aichi-ken (JP); Nobumasa Ueda, Nagoya (JP); Hiroshi Fujimoto, Nagoya (JP); Yoshiki Koyama, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/146,741

(22) Filed: May 16, 2002

(65) Prior Publication Data

US 2002/0171455 A1 Nov. 21, 2002

(30) Foreign Application Priority Data

| May 17, 2001 | (JP) | 2001-147714 |
| Aug. 23, 2001 | (JP) | 2001-252859 |
| Aug. 24, 2001 | (JP) | 2001-254402 |
| Aug. 31, 2001 | (JP) | 2001-263493 |

(51) Int. Cl.[7] .................................................. H03K 3/00
(52) U.S. Cl. ..................... 327/108; 327/109; 323/274
(58) Field of Search .................................. 327/108, 109, 327/110, 91, 263, 264; 326/82, 83, 85; 318/685, 599, 729; 323/274

(56) References Cited

U.S. PATENT DOCUMENTS

| 4,516,065 A | * | 5/1985 | Ninomiya et al. | 318/811 |
| 5,818,283 A | | 10/1998 | Tonami et al. | 327/436 |
| 5,886,484 A | | 3/1999 | Fucili et al. | 318/254 |
| 5,896,020 A | | 4/1999 | Pyo | 318/701 |
| 5,923,546 A | * | 7/1999 | Shimada et al. | 363/40 |
| 6,184,663 B1 | * | 2/2001 | Imai et al. | 323/274 |

FOREIGN PATENT DOCUMENTS

| JP | 52-112263 | 9/1977 |
| JP | 61-71584 | 4/1986 |
| JP | 1-320813 | 12/1989 |
| JP | 5-37323 | 2/1993 |
| JP | 5-83100 | 4/1993 |
| JP | 5-83583 | 4/1993 |
| JP | 5-211451 | 8/1993 |
| JP | 6-225593 | 8/1994 |
| JP | 6-292360 | 10/1994 |
| JP | 6-315259 | 11/1994 |
| JP | 9-27736 | 1/1997 |
| JP | 9-127454 | 5/1997 |
| JP | 9-135572 | 5/1997 |
| JP | 9-204230 | 8/1997 |
| JP | 9-308287 | 11/1997 |
| JP | 11-150957 | 6/1999 |
| JP | 2000-138570 | 5/2000 |

* cited by examiner

*Primary Examiner*—My-Trang Nuton
*Assistant Examiner*—Hiep Nguyen
(74) *Attorney, Agent, or Firm*—Harness, Dickey & Pierce, PLC

(57) ABSTRACT

A current control circuit controls a gate potential of a transistor to equalize a load current IL with a trapezoidal wave signal Sb. The trapezoidal wave signal Sb increases at a constant gradient when a drive command signal Sa turns into H level. Due to increase of load current IL, the transistor starts operating in a linear region and a gate voltage VGS abruptly increases. A saturation state detecting circuit turns a current saturation signal Sc into L level when the gate voltage VGS exceeds a reference voltage Vr. A trapezoidal wave generating circuit stops increase of trapezoidal wave signal Sb. When drive command signal Sa turns into L level, the trapezoidal wave signal Sb decreases at a constant gradient. The load current IL decreases according to reduction of trapezoidal wave signal Sb.

25 Claims, 19 Drawing Sheets

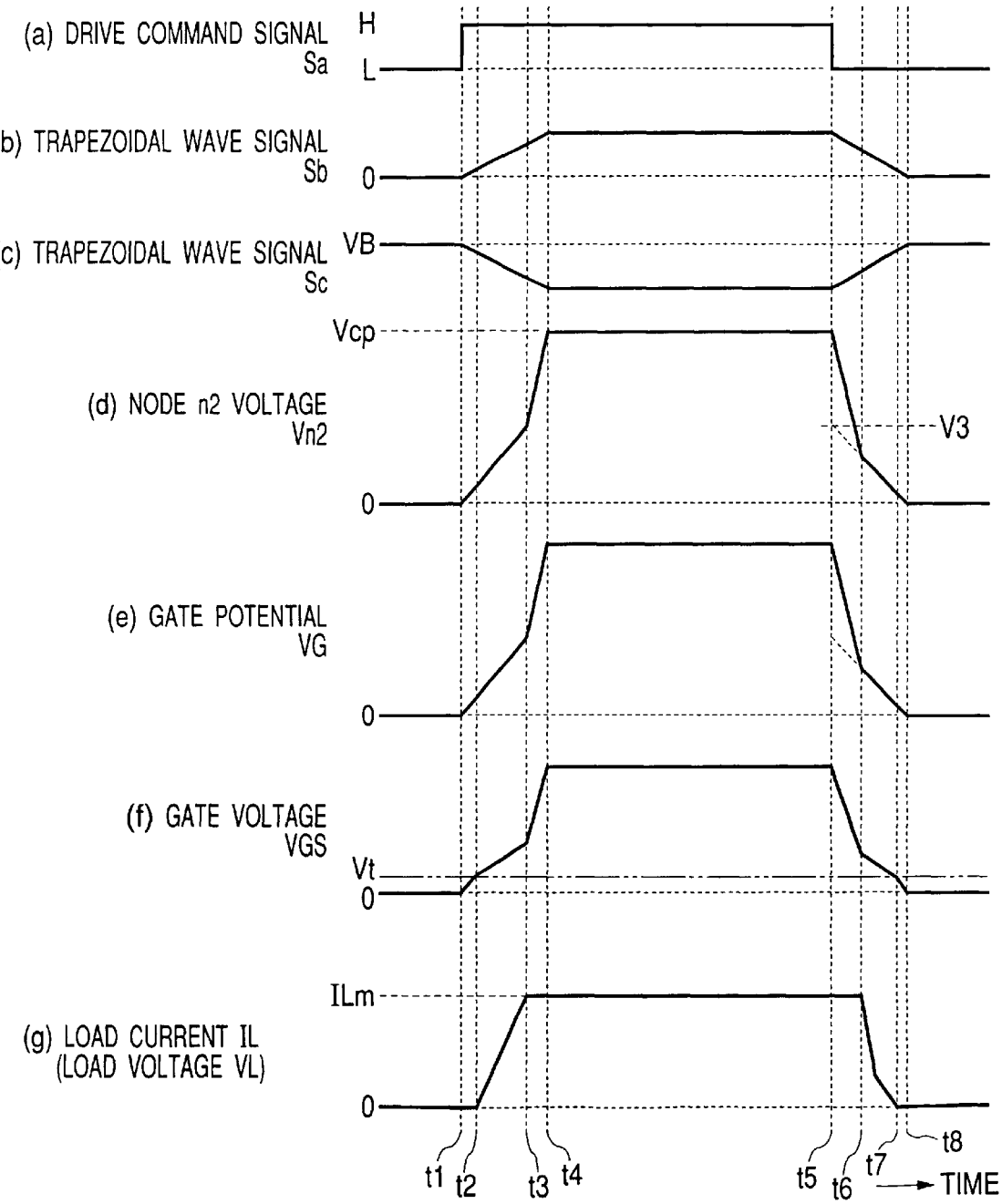

ELECTRIC LOAD DRIVE APPARATUS

BACKGROUND OF THE INVENTION

The present invention relates to an electric load drive apparatus for supplying a trapezoidal wave current to an electric load.

An electric load, such as a lamp or a coil, has an impedance (i.e., a resistance value) varying in response to heat generation during its activation. In the beginning of activation, the electric load has a relatively small resistance value. A relatively large current will flow across the electric load. Accordingly, the electric load will cause significant noise. To solve this problem, U.S. Pat. No. 6,184,663 corresponding to the unexamined Japanese patent publication 2000-138570 discloses an electric load drive apparatus shown in FIG. 5.

A conventional electric load drive circuit 1 shown in FIG. 5 comprises a resistor 4 and a MOS transistor 5 serially interposed between a battery 2 and an electric load 3 (such as a lamp), a trapezoidal wave generating circuit 6 which generates a trapezoidal wave signal Sb in accordance with a drive command signal Sa, and a current control circuit 7 which compares the trapezoidal wave signal Sb with a voltage value detected by the resistor 4 to control a gate voltage of MOS transistor 5.

Although not shown in the drawing, the trapezoidal wave generating circuit 6 consists of a capacitor, a charging constant-current circuit, and a discharging constant-current circuit. A trapezoidal wave signal Sb is produced between both terminals of the capacitor of trapezoidal wave generating circuit 6. The upper edge voltage of trapezoidal wave signal Sb is controlled to be a constant value. The current control circuit 7 consists of a voltage conversion circuit 8 and an error amplification circuit 9. The voltage conversion circuit 8 produces a trapezoidal wave signal Sd by inverting the trapezoidal wave signal Sb. The trapezoidal wave signal Sb has an electric potential defined with respect to a ground potential, while the trapezoidal wave signal Sd has an electric potential defined with respect to the reference battery voltage VB. The error amplification circuit 9 compares the inverted trapezoidal wave signal Sd with the voltage applied to the resistor 4. The error amplification circuit 9 controls the gate potential of MOS transistor 5 so as to equalize the voltage applied to the resistor 4 with the inverted trapezoidal wave signal Sd.

According to this arrangement, a lamp current (i.e., the current flowing across the electric load 3 (=lamp)) linearly increases in accordance with voltage increase of trapezoidal wave signal Sb in the beginning of activation of this lamp. The lamp current linearly decreases in accordance with voltage decrease of trapezoidal wave signal Sb after deactivating the lamp. When the drive command signal Sa is a cyclic pulse signal, the brightness of lamp can be adjusted by changing the duty ratio of drive command signal Sa.

When the electric load 3 is a lamp installed in an automotive vehicle, it is not assured that the lamps exchanged by a user or a car repairer are always the same type. For example, there is the possibility that a user may install another type of lamp which has a different rated current (i.e., impedance).

According to the above-described conventional electric load drive circuit 1, the upper edge of trapezoidal wave signal Sb is determined in the following manner. It is now assumed that the installed electric load 3 is a specific lamp having the largest rated current (e.g., rated current=6A). Under this condition, the upper edge of trapezoidal wave signal Sb is determined so that MOS transistor 5 operates in a saturation region until the trapezoidal wave signal Sb reaches the upper edge voltage and MOS transistor 5 operates in a linear region after the trapezoidal wave signal Sb has reached the upper edge voltage.

By determining the upper edge voltage in this manner, it becomes possible to suppress drain loss of MOS transistor 5.

However, if an installed lamp has a rated current having a rated current smaller (i.e., an impedance larger) than that of the above-described specific lamp, brightness adjustment of a lamp may cause a trouble as explained hereinafter with reference to FIG. 6.

FIG. 6 is a time chart showing the waveforms of various portions in the conventional electric load drive circuit in the case an electric load is a specific lamp having a rated current of 6A or another type of lamp having a rated current of 6A. The waveforms shown in FIG. 5 are (a) drive command signal Sa, (b) trapezoidal wave signal Sb, (c) lamp current (rated current=6A), (d) lamp voltage (rated current=6A), (e) lamp current (rated current=3A), and (f) lamp voltage (rated current=3A).

When a lamp having a rated current of 6A is connected to the electric load drive circuit 1, the lamp voltage (i.e., a voltage applied to the lamp) increases or decreases in accordance with ascent or descent of trapezoidal wave signal Sb. The trapezoidal wave signal Sb is derived from drive command signal Sa. The lamp voltage is equal to the battery voltage VB during a term the trapezoidal wave signal Sb is equal to the upper edge voltage. For example, a current supply threshold can be set to a mid point (3A) of the current amplitude with respect to a trapezoidal wave lamp current (as shown by an alternate long and two short dashes line in FIG. 6(e)). The duty ratio of lamp current, being set based on the current supply threshold, can be always equalized with the duty ratio of drive command signal Sa. It becomes possible to adjust the brightness of lamp according to a given command.

On the other hand, when a lamp having a rated current of 3A is connected to the electric load drive circuit 1, the lamp current increases in accordance with ascent of trapezoidal wave signal Sb. However, the lamp current becomes equal with the battery voltage VB at time tb and stops increasing before the trapezoidal wave signal Sb reaches the upper side voltage. Furthermore, the trapezoidal wave signal Sb starts decreasing at time td. Then, waiting for passage of a time lag, the lamp voltage starts decreasing at time te. As a result, significant deviation is caused between the waveform of the lamp current and the waveform of trapezoidal wave signal Sb at each of time durations tb-tc and td-te.

Hence, the above-described duty ratio of lamp current (i.e., effective current supply time) becomes larger than the duty ratio of drive command signal Sa (i.e., commanded current supply time).

In this manner, when a lamp having a rated current smaller than that of the above-described specific lamp is connected to the electric load drive circuit 1, the duty ratio of lamp current (i.e., effective current supply time for determining the brightness of lamp) cannot agree with the light adjusting command given by drive command signal Sa. Furthermore, the duty ratio of lamp current cannot be lowered sufficiently. The brightness of lamp may not be reduced sufficiently.

SUMMARY OF THE INVENTION

In view of the foregoing problems of the prior art, the present invention has an object to provide an electric load drive apparatus which is capable of equalizing an actual current supply time with a commanded current supply time designated by a drive command signal irrespective of impedance of this electric load.

In order to accomplish the above and other related objects, the present invention provides an electric load drive apparatus comprising a switching element provided in an electric power supply path extending from a direct-current power source to an electric load. A detecting resistor, connected in series with the switching element, detects a voltage value representing a load current flowing across the electric load via the switching element. A saturation state detecting section is provided for outputting a current saturation signal during a term an upper limit current flows across the electric load. The upper limit current is a maximum current flowable via the switching element. A signal generating section is provided for producing a trapezoidal wave signal. The voltage value of this trapezoidal wave signal starts changing in accordance with increase of the load current when a drive start command signal is entered, stops changing in response to the output of the current saturation signal generated from the saturation state detecting section, and then starts changing in accordance with decrease of the load current when a drive stop command signal is entered. And, a current control section is provided for comparing the trapezoidal wave signal produced from the signal generating section with the voltage value detected by the detecting resistor and then controlling the switching element based on the trapezoidal wave signal in such a manner a trapezoidal wave current flows across the electric load.

According to the arrangement of the electric load drive apparatus of this invention, the detecting resistor produces a voltage proportional to the load current flowing across the electric load. The current control section compares the trapezoidal wave signal produced from the signal generating section with the voltage value detected by the detecting resistor and then controls the switching element based on the trapezoidal wave signal. Hence, a trapezoidal wave current flows across the electric load. As a result, it becomes possible to suppress the load current from abruptly increasing in the beginning of activation of the electric load. Thus, it becomes possible to suppress generation of noise which may be produced due to abrupt change of load current.

The load current flowing across the electric load via the switching element from the direct-current power source has an upper limit value which is dependent on voltage of direct-current power source, impedance of the electric load, and open/close state of the switching element. The saturation state detecting section detects a current saturation state that the upper limit current flows across the electric load via the switching element in the open/close controllable range of the switching element. The signal generating section causes the voltage value of the trapezoidal wave signal to start changing in accordance with increase of the load current when the drive start command signal is entered. And then, the signal generating section causes the voltage value of the trapezoidal wave signal to stop changing in response to detection of the current saturation state.

Namely, according to the signal generating section of this invention, the upper edge voltage of the trapezoidal wave signal is not controlled to a constant value. Rather, the upper edge voltage of the trapezoidal wave signal is controlled to a value corresponding to the above-described upper limit current determined by the voltage of the direct-current power source and the impedance of the electric load. Hence, it becomes possible to prevent the trapezoidal wave signal from generating a command exceeding the above-described upper limit current which is not actually obtained. The electric load can always receive a current corresponding to the trapezoidal wave signal. As a result, when the drive stop command is entered and the trapezoidal wave signal starts changing in accordance with decrease of the load current, the load current immediately starts decreasing in accordance with the trapezoidal wave signal.

Accordingly, irrespective of impedance of an electric load to be connected, the load current always follows the trapezoidal wave signal produced based on the drive command signal. The effective current supply time of a trapezoidal wave load current can be always equalized with the commanded current supply time designated by the drive command signal.

Furthermore, it is preferable that the switching element is constituted by a transistor capable of controlling the load current in accordance with an input voltage entered to a control terminal thereof, the current control section comprises an operational amplifier outputting a voltage corresponding to a potential difference between the trapezoidal wave signal produced from the signal generating section and the voltage value detected by the detecting resistor, and the current control section controls the input voltage supplied to the control terminal of the transistor in accordance with the output voltage of the operational amplifier.

According to this arrangement, the error amplification function of operational amplifier allows the transistor to control its ON state in such a manner that the trapezoidal wave signal of the signal generating section with the voltage value detected by the detecting resistor. The electric load always receives the current corresponding to the commanded trapezoidal wave signal.

Furthermore, it is preferable that the saturation state detecting section comprises a comparator comparing a control voltage of the transistor with a predetermined reference voltage.

According to this arrangement, if the trapezoidal wave signal exceeds a value corresponding to the upper limit current flowable across the above-described electric load, a deviation between the load current and the trapezoidal wave signal will increase. The control voltage of the transistor will abruptly increase due to feedback control by the operational amplifier. The comparator constituting the saturation state detecting section compares the control voltage of the transistor with the predetermined reference voltage, thereby detecting such an abrupt voltage increase (i.e., current saturation state). Therefore, the saturation state detecting section of the present invention can surely detect the current saturation state even if the voltage of direct-current power source fluctuates.

Furthermore, it is preferable that the signal generating section comprises a capacitor outputting the trapezoidal wave signal, a first constant-current circuit connected in series with the capacitor, a second constant-current circuit connected in parallel with the capacitor to perform a constant-current operation during a term the drive stop command signal is entered, and a third constant-current circuit connected in series with the first constant-current circuit to input an output current of the first constant-current circuit during a term the saturation state detecting section outputs the current saturation signal.

According to this arrangement, both of the second constant-current circuit and the third constant-current circuit suspend their constant current operations when the drive start command signal is entered under a condition the drive stop command signal and the current saturation signal are not entered into the signal generating section. Hence, a constant charging current flows into the capacitor from the first constant-current circuit. The voltage applied to the capacitor starts changing in accordance with increase and decrease of load current. Subsequently, when the current saturation signal is entered, the third constant-current circuit receives the output current of the first constant-current circuit. The charging of the capacitor is interrupted. The voltage applied to the capacitor stops changing. Subsequently, when the drive stop command signal is entered, the discharging current flows into the second constant-current circuit from the capacitor. The voltage applied to the capacitor starts changing in accordance with increase and decrease of load current. As a result, the above-described trapezoidal wave signal is produced from both terminals of the capacitor.

Furthermore, it is preferable that the signal generating section comprises a limit circuit for suppressing a voltage applied to the capacitor within a predetermined voltage.

According to this arrangement, the upper edge voltage of the trapezoidal wave signal is limited to the predetermined value. This surely prevents the load current from exceeding the above-described predetermined value even when the voltage of direct-current power source is excessively large or when the electric load has an excessively small impedance.

Moreover, it is preferable that each of the drive start command signal and the drive stop command signal is a PWM signal having a duty ratio corresponding to the load current. As the command current supply time commanded by the drive command signal is equalized with the effective current supply time of the load current, the current having a duty ratio identical with the duty ratio of the PWM signal flows across the electric load.

Furthermore, the present invention has an object to provide a control apparatus for a power MOS transistor which is capable of suppressing noise and heat generation.

In order to accomplish the above and other related objects, the present invention provides a control apparatus for a power MOS transistor comprising a power MOS transistor interposed between an electric load and a power source for causing a trapezoidal pulse current to flow across the electric load when a control voltage is applied to a gate terminal of the power MOS transistor. A gate-source voltage detecting section is provided for detecting a gate-source voltage of the power MOS transistor when the control voltage is applied to the gate terminal of the power MOS transistor. A feedback section is provided for obtaining deviations of rise time and fall time of a present load current waveform with respect to their target values based on the gate-source voltage of the power MOS transistor detected by the gate-source voltage detecting section. The feedback section performs a feedback control of the power MOS transistor so as to eliminate the deviations of rise time and fall time.

In this manner, even if the resistance value of an electric load changes due to activation of the electric load, it becomes possible to suppress the rising and falling gradients of the load current within predetermined values. It is effective to suppress noise and heat generation.

Furthermore, it is preferable that the rise time and the fall time of the present load current waveform are obtained by measuring the duration of a saturation region in the transistor characteristics.

It is also preferable that control apparatus for a power MOS transistor of the present invention further comprises a first comparing section for comparing the detected gate-source voltage with a first judgement value being set between an OFF voltage and a threshold voltage. A second comparing section is provided for comparing the detected gate-source voltage with a second judgement value being set between an ON voltage and the threshold voltage. And, a time measuring section is provided for measuring elapse of time between the first judgement value and the second judgement value based on comparing results obtained by the first comparing section and the second comparing section. The time measuring section designates the measured time elapse as the duration of the saturation region in the transistor characteristics.

It is also preferable that the feedback control of the power MOS transistor is performed in such a manner that the rise time and the fall time become constant.

It is also preferable that the electric load is a lamp.

Furthermore, the present invention has an object to provide an electric load drive apparatus which is capable of suppressing noise caused due to supply or stop of electric current in a case a trapezoidal current is supplied to an electric load.

In order to accomplish the above and other related objects, the present invention provides an electric load drive apparatus comprising a signal generating section for generating a current command signal in accordance with a drive command signal entered from an external device. The current command signal has a trapezoidal waveform increasing from a first level to a second level in response to a drive start command and decreases from the second level to the first level in response to a drive stop command. A current drive section, provided in a current supply path extending from a direct-current power source to an electric load, detects a load current flowing across the electric load and outputs a trapezoidal current to the electric load based on a comparison between the detected load current and the current command signal. A measuring section is provided for measuring a rise time of the load current corresponding to increase of the current command signal and a fall time of the load current corresponding to decrease of the current command signal. And, a gradient control section is provided for controlling a change rate of the current command signal produced from the signal generating section in such a manner that the measured rise time is equalized with a predetermined reference rise time and the measured fall time is equalized with a predetermined reference fall time.

According to this arrangement, the current drive section detects the load current flowing across the electric load and outputs the trapezoidal current to the electric load based on a comparison between the detected load current and the current command signal. With this arrangement, it becomes possible to limit the change rate of the load current in a moment the current supply to the electric load is started or stopped. It becomes possible to effectively reduce the noise caused by the load current changing abruptly. Furthermore, as the load current is directly controlled, distortion of current can be suppressed to a small value and the noise can be surely reduced.

In this case, for example, the reference rise time and the reference fall time are determined so as to suppress the generated noise and the drive loss to an allowable level. The gradient control section controls the change rate (i.e., increase rate and decrease rate) of the current command signal in such a manner that the measured rise time is equalized with the reference rise time and the measured fall time is equalized with the reference fall time. As a result, the load current increases for the reference rise time and decreases for the reference fall time irrespective of impedance of electric load. Namely, the rise and fall of load current are limited to minimum change rates in an allowable region considering the drain loss of current drive section. Thus, it becomes possible to reduce the noise generated when the electric load is activated or deactivated.

It is preferable that the gradient control section comprises a gradient limit section for preventing the change rate (i.e., increase rate and decrease rate) of the current command signal from exceeding a predetermined regulation value. This effectively prevents the generated noise from exceeding an allowable level when the connected electric load has a small impedance.

Furthermore, it is preferable that the measuring section comprises a voltage detecting section for detecting a load voltage applied on the electric load when the current command signal is in the second level, a reference voltage generating section for generating a first reference voltage and a second reference voltage having mutually different ratios with respect to the detected load voltage of the voltage detecting section, and a time measuring section for measuring a time required for the load voltage applied on the electric load to vary from the first reference voltage to the second reference voltage or vice versa.

According to this arrangement, the rise and fall times of the load voltage are measured to indirectly detect rise and fall times of the load current. When the current command signal is in the second level (i.e., the upper edge of a trapezoidal wave), the load current is at the upper edge of a trapezoidal wave. Hence, by measuring the time required for the load voltage to vary from the first reference voltage to the second reference voltage or vice versa, it becomes possible to obtain the rise time and the fall time of the load current.

Furthermore, it is preferable that the signal generating section comprises a capacitor for outputting the current command signal, a first current output circuit having a controllable output current for supplying a charge current of the capacitor, and a second current output circuit having a controllable output current for supplying a discharge current of the capacitor.

According to this arrangement, when the drive start command is given, the first current output circuit supplies charge current to the capacitor to increase the capacitor from the first level to the second level. On the other hand, when the drive stop command is given, the discharge current flows from the second current output circuit to allow the voltage of capacitor to decrease from the second level to the first level.

Furthermore, it is preferable that the gradient control section comprises a first current control section for controlling the output current of the first current output circuit based on a difference between the rise time measured by the measuring section and the reference rise time, and a second current control section for controlling the output current of the second current output circuit based on a difference between the fall time measured by the measuring section and the reference fall time. With this arrangement, it becomes possible to independently control the rise time and the fall time of the load current.

Furthermore, it is preferable that each of the first and second current output circuits produces a current in accordance with an entered control voltage, and each of the first and second current control sections comprises a capacitor for outputting the control voltage, a charge circuit for charging the capacitor when the difference is positive, and a discharge circuit for discharging the capacitor when the difference is negative.

According to this arrangement, the first and second current control sections of the gradient control section are constituted as a charge/discharge circuit consisting of the capacitor, the charge circuit, and the discharge circuit. The output voltages of these charge/discharge circuits are used to control the output currents of the first and second current output circuits of the signal generating section. When the rise time of the load current is longer than the reference rise time (i.e., when the difference is positive), the capacitor is charged to increase the output current of the first current output circuit. As a result, the rise time of the current command signal can be reduced. The same explanation is applied to the fall of load current.

Furthermore, it is preferable that the current drive section comprises a switching element provided in a current supply path extending from the direct-current power source to the electric load, a current detecting section for detecting the load current and producing a current detecting signal, and a load current control section for controlling the switching element based on a difference between the current detecting signal and the current command signal.

According to this arrangement, the load current control section controls on-off condition of the switching element provided in the current supply path extending from the direct-current power source to the electric load in such a manner that the difference between the current detecting signal and the current command signal can be reduced. With this arrangement, the current drive section can supply a trapezoidal current to the electric load in accordance with the current command signal.

Moreover, it is preferable that the drive command signal is a cyclic pulse signal (e.g., PWM signal) having a controlled duty ratio. In this case, in each period of the pulse signal, the measuring section measures the rise time and the fall time of the load current while the gradient control section controls the increase rate and the decrease rate of the current command signal. Hence, it becomes possible to always and accurately equalize the rise time and the fall time of the load current with their reference values. The noise can be surely reduced.

Furthermore, the present invention has an object to provide an electric load drive apparatus capable of suppressing distortion of waveform appearing at a decreasing start time of load current in a case a trapezoidal current is supplied to an electric load.

In order to accomplish the above and other related objects, the present invention provides an electric load drive apparatus comprising a transistor provided in a current path extending from a direct-current power source to an electric load for controlling a load current flowing across the electric load based on a control signal. A current detecting section is provided for detecting the load current flowing across the electric load. A signal generating section is provided for generating a current command signal in accordance with a drive command signal entered from an external device. The current command signal has a trapezoidal waveform increasing from a first level to a second level in response to a drive start command and decreasing from the second level to the first level in response to a drive stop command. A current control section is provided for supplying the control signal based on a comparison between a current detection signal detected by the current detecting section and the current command signal in such a manner that a trapezoidal current flows across the electric load in accordance with the current command signal. And, a control voltage limit section is provided for limiting the control signal to a decreasing start level in response to the drive stop command. The decreasing start level is slightly higher than a threshold level of the transistor required to reduce the current flowing across the electric load.

According to this arrangement, the load current is controlled to have a trapezoidal waveform. Thus, it becomes possible to adequately suppress the change rate of load current at a current start or stop time. Thus, it becomes possible to suppress the noise generating due to abrupt change of load current.

In this case, the first level and the second level are determined beforehand so as to correspond to the lower edge and the upper edge of the trapezoidal current command signal. When the impedance of the electric load becomes high, the load current cannot increase up to a current value commanded by the second level of the current command signal due to shortage of direct-current power source voltage. In such a non-following state of load current in the vicinity of the second level, the current detection signal largely deviates from the current command signal. The control signal produced from the current control section becomes large compared with the value adjacent to a threshold value in a case where the transistor actually increases or decreases the current flowing across the current. As a result, excessive electric charge is stored in a capacitor of the transistor (such as a gate capacitor of MOS transistor).

However, the control voltage limit section of the present invention limits the control signal to the decreasing start level in response to the drive stop command. The decreasing start level is slightly higher than the threshold level of the transistor. Thus, it becomes possible to promptly draw the excessive electric charge stored in the capacitor of the transistor (e.g., gate capacitor of MOS transistor). The load current quickly follows the reduction of control signal corresponding to the reduction of current command signal. Hence, it becomes possible to prevent the load current from decreasing abruptly. As a result, it becomes possible to effectively suppress the noise.

It is preferable that the control voltage limit section limits the control signal to the decreasing start level defined with respect to a source or emitter potential of the transistor in response to the drive stop command.

According to this arrangement, the decreasing start level of control signal is set with respect to the source or emitter potential of the transistor. According to this setting, no adverse influence is given from the load voltage applied to the electric load. Thus, irrespective of direct-current power source voltage, it becomes possible to accurately limit the control signal to the decreasing start level adjacent to the threshold level.

Furthermore, it is preferable that the current control section comprises an error amplifying section for outputting the control signal corresponding to a difference between the current detection signal and the current command signal, and the control voltage limit section is connected between an output terminal of the error amplifying section and a source or emitter terminal of the transistor.

According to this arrangement, the error amplifying section outputs the control signal corresponding to a difference between the current detection signal and the current command signal. The control voltage limit section forcibly limits the voltage (i.e., control voltage) of the output terminal of the error amplifying section to the decreasing start level in response to the drive stop command. Thus, it becomes possible to accomplish the current control the transistor within a short time.

Furthermore, it is preferable that the control voltage limit section is connected between gate and source terminals of the transistor or between base and emitter terminals of the transistor.

According to this arrangement, the control voltage limit section limits the gate-source voltage or base-emitter voltage of the transistor to the decreasing start level in response to the drive stop command.

Furthermore, it is preferable that the control voltage limit section is constituted by a serial circuit of a switch circuit turning on in response to the drive stop command and a voltage limit circuit having a clamp voltage equivalent to the decreasing start level.

According to this arrangement, the switch circuit constituted by a transistor is turned on in response to the drive stop command. In this case, the control signal is limited to the clamp voltage by the voltage limit circuit. The voltage limit circuit can be constituted by a Zener diode.

BRIEF DESCRIPTION OF THE DRAWINGS

The above and other objects, features and advantages of the present invention will become more apparent from the following detailed description which is to be read in conjunction with the accompanying drawings, in which:

FIG. 20 is a time chart showing the waveforms of various portions in the conventional electric load drive apparatus shown in FIG. 5.

DESCRIPTION OF THE PREFERRED EMBODIMENTS

Figure 1:
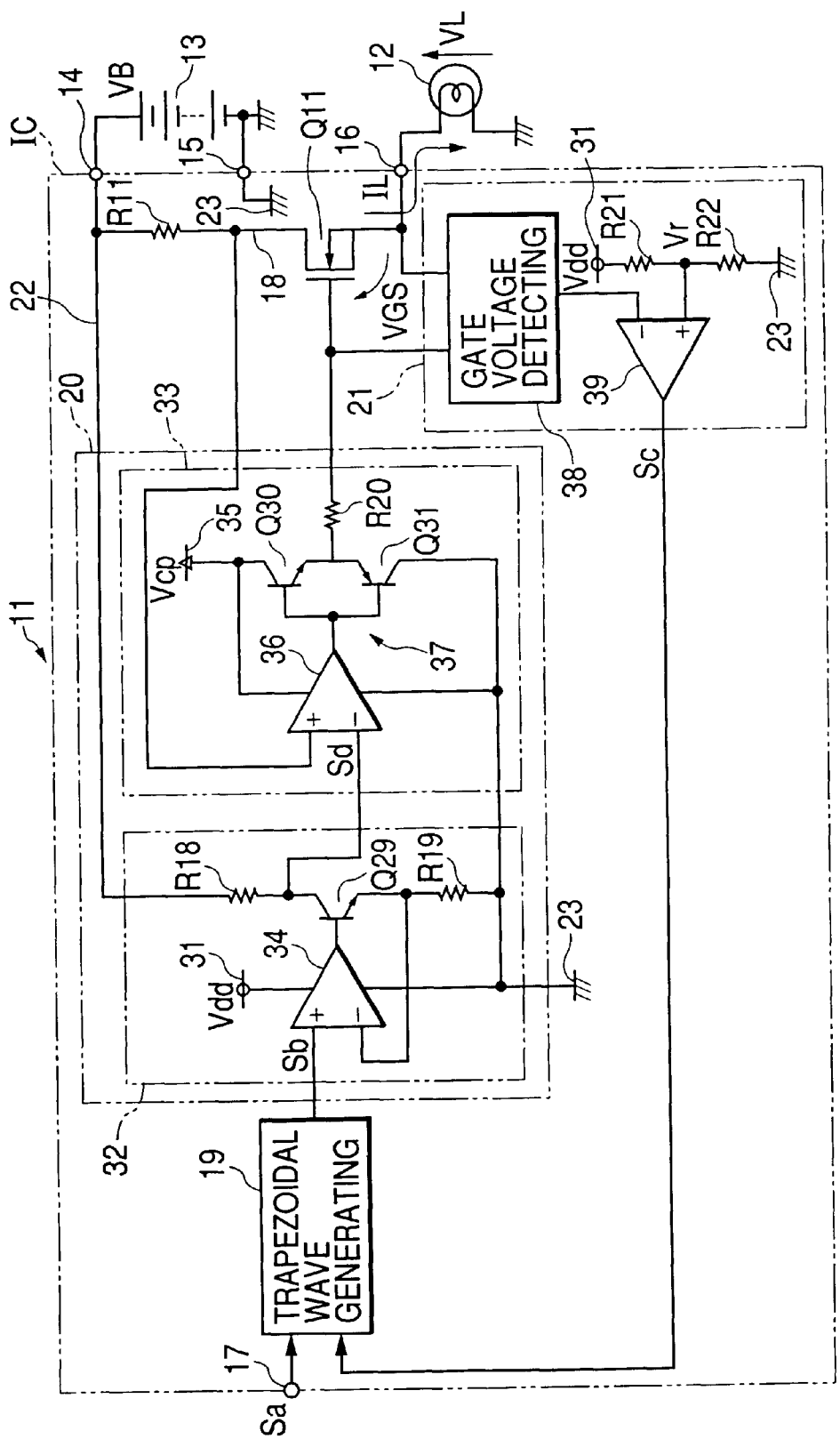
FIG. 1 is a circuit diagram showing the arrangement of an electric load drive apparatus in accordance with a first embodiment of the present invention.

Preferred embodiments of the present invention will be explained hereinafter with reference to attached drawings. Identical parts are denoted by the same reference numerals throughout the drawings.

First Embodiment

Hereinafter, a first embodiment of the present invention will be explained with reference to FIGS. 1 to 4. FIG. 1 shows the arrangement of an electric load drive circuit which serves as an electric load drive apparatus of the present invention.

An electric load drive circuit 11 is constituted as an integrated circuit together with an electric power circuit (not shown) and a control circuit. The electric load drive circuit 11 receives a drive command signal Sa entered from an outside device, and controls (i.e., turns on and off or adjusts the brightness of) various lamps of an automotive vehicle, such as headlights, instrument panel indicators, and a passenger compartment lamp, in response to the received drive command signal Sa.

The electric load drive circuit 11 has power source terminals 14 and 15 respectively connected to positive and negative terminals of a battery 13. The battery 13 is a direct-current power source. The electric load drive circuit 11 has an output terminal 16. An electric load 12 is connected between the output terminal 16 and a ground line. The ground line has the same potential as the negative terminal of the battery 13. The electric load drive circuit 11 has an input terminal 17 through which the drive command signal Sa is entered.

In the electric load drive circuit 11, a power supply path 18 is provided between the power source terminal 14 and the output terminal 16. Resistor R11 and N-channel power MOS transistor Q11 are serially connected in this power supply path 18. The resistor R11, serving as a detection resistor of the present invention, detects a current (i.e., load current IL) flowing across the electric load 12. The N-channel power MOS transistor Q11 serves as switching element of the present invention. The N-channel power MOS transistor Q11 is thus connected to a higher potential side of electric load 12.

Other than the resistor R11 and the MOS transistor Q11, the electric load drive circuit 11 comprises a trapezoidal wave generating circuit 19 (serving as signal generating section of the present invention), a current control circuit 20 (serving as current control section of the present invention), and a saturation state detecting circuit 21 (serving as saturation state detecting section of the present invention). The trapezoidal wave generating circuit 19 and the saturation state detecting circuit 21 cooperatively provide a characteristic circuit arrangement of the present invention. Hereinafter, the circuit arrangement of each circuit will be explained in details.

Figure 2:
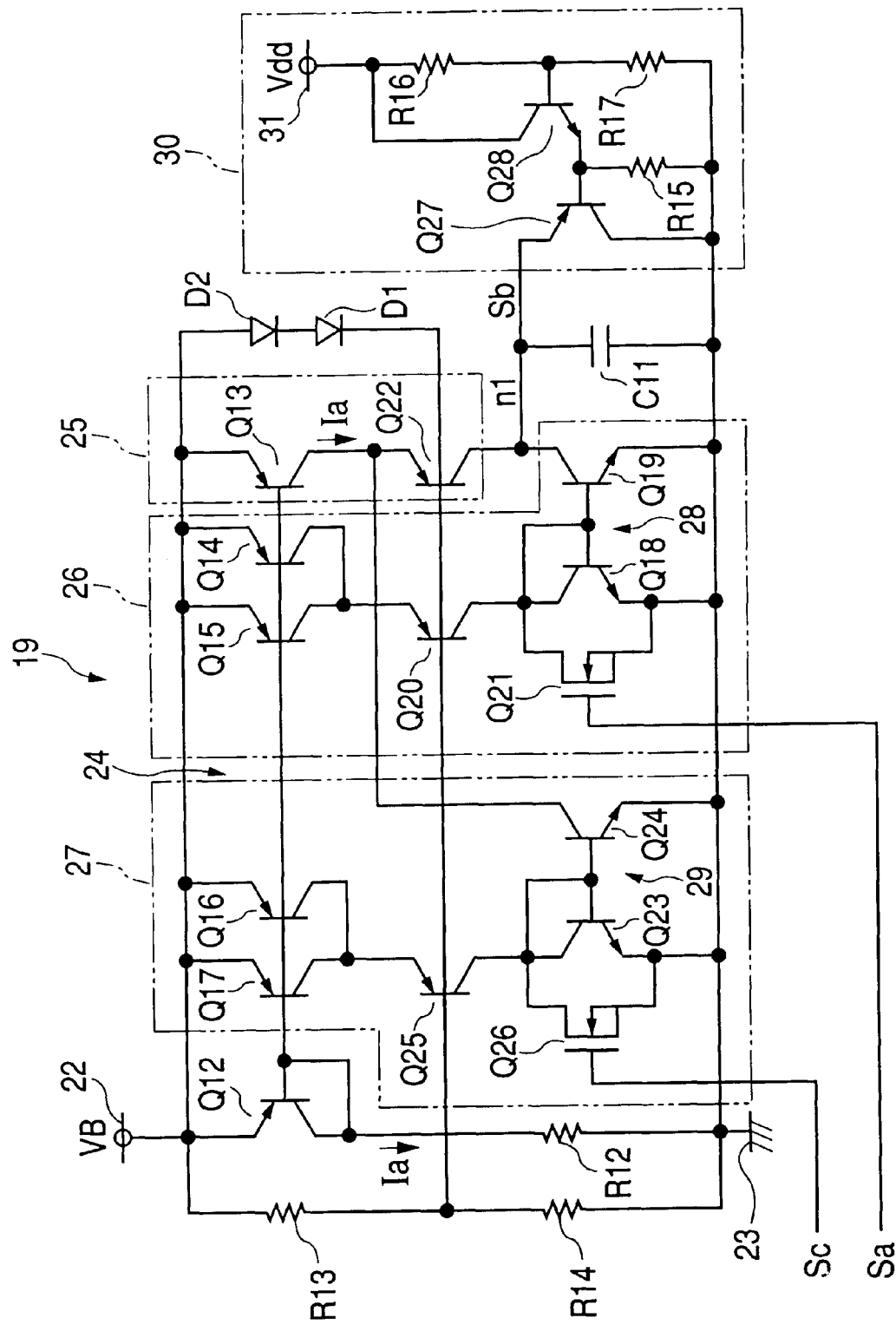
FIG. 2 is a circuit arrangement of a trapezoidal wave generating circuit of the electric load drive apparatus shown in FIG. 1.

FIG. 2 shows the detailed arrangement of trapezoidal wave generating circuit 19. In FIG. 2, PNP transistor Q12 of diode connection pattern and a resistor R12 are serially connected between a power source line 22 and a ground line 23. The power source line 22 is connected to the power source terminal 14. The ground line 23 is connected to the power source terminal 15. The transistor Q12 has a base directly connected to respective bases of PNP transistors Q13 to Q17 which are connected to the power source line 22. As a whole, a current mirror circuit 24 is constituted by these transistors Q12 to Q17. Each of the transistors Q12 to Q17 has the same emitter area. The transistors Q14 and Q15 have collectors connected to each other. The transistors Q16 and Q17 have collectors connected to each other.

The trapezoidal wave generating circuit 19 comprises three constant-current circuits 25, 26 and 27 respectively utilizing the current mirror circuit 24. The constant-current circuit 26, serving as second constant-current circuit, consists of the above-described transistors Q14 and Q15, NPN transistors Q18 and Q19, PNP transistor Q20, and N-channel MOS transistor Q21. NPN transistors Q18 and Q19 cooperatively constitute a current mirror circuit 28. The transistor Q18 is connected to the transistors Q14 and Q15 via the PNP transistor Q20. The MOS transistor Q21 is connected in parallel with the transistor Q18. The MOS transistor Q21 has a gate to which the above-described drive command signal Sa is entered.

The transistor Q19 has a collector which serves as output node n1 of the trapezoidal wave generating circuit 19. The output node n1 is connected to the ground line 23 via capacitor C11. As described later, a trapezoidal wave signal Sb having a voltage of trapezoidal wave is produced from the output node n1 (i.e., between both terminals of capacitor C11). The output node n1 is connected to the collector of transistor Q13 via PNP transistor Q22. The transistors Q13 and Q22 cooperatively constitute a constant-current circuit 25 which serves as first constant-current circuit of the present invention.

The constant-current circuit 27, serving as third constant-current circuit, consists of the above-described transistors Q16 and Q17, NPN transistors Q23 and Q24, PNP transistor Q25, and N-channel MOS transistor Q26. NPN transistors Q23 and Q24 cooperatively constitute a current mirror circuit 29. The transistor Q23 is connected to the transistors Q16 and Q17 via the PNP transistor Q25. The MOS transistor Q26 is connected in parallel with the transistor Q23. The MOS transistor Q26 has a gate to which a later-described current saturation signal Sc is entered.

Transistors Q20, Q22, and Q25 are used to suppress Early effect of transistors Q13 to Q17. Transistors Q20, Q22, and Q25 have a common base which is connected to the power source line 22 via diodes D1 and D2. The diodes D1 and D2, serially connected to each other, have the polarities as shown in FIG. 2. The common base of transistors Q20, Q22, and Q25 is also connected to the power source line 22 via resistor R13, and is further connected to the ground line 23 via resistor R14.

Furthermore, to suppress the load current IL from excessively increasing due to increase of battery voltage VB, the trapezoidal wave generating circuit 19 comprises a voltage limit circuit 30 for limiting the voltage of output node n1. The voltage limit circuit 30 serves as limit circuit of the present invention. Both terminals of capacitor C11 are connected to an emitter and a collector of PNP transistor Q27. The transistor Q27 has a base connected to the ground line 23 via resistor R15 and to an emitter of NPN transistor Q28. The transistor Q28 has a collector connected to a power source line 31. The transistor Q28 has a base connected to a joint point of resistors R16 and R17 serially connected between the power source line 31 and the ground line 23. The power source line 31 is an output line of a power source circuit (not shown) which receives the battery voltage VB and generates a control power voltage Vdd (e.g., 5V).

Returning to FIG. 1, the current control circuit 20 consists of a voltage conversion circuit 32 and an error amplification circuit 33. The voltage conversion circuit 32 converts the trapezoidal wave signal Sb into a trapezoidal wave signal Sd by inverting the trapezoidal wave signal Sb. The trapezoidal wave signal Sb has an electric potential defined with respect to the reference voltage of ground line 23, while the trapezoidal wave signal Sd has an electric potential defined with respect to the reference voltage of power source line 22. An operational amplifier 34 operates when it receives the control power voltage Vdd from power source line 31. The operational amplifier 34 has a non-inverting input terminal connected to the output node n1 of trapezoidal wave generating circuit 19. The operational amplifier 34 has an output terminal connected to a base of NPN transistor Q29. The operational amplifier 34 has an inverting terminal connected to an emitter of NPN transistor Q29. The transistor Q29 has a collector connected to the power source line 22 via a resistor R18. The transistor Q29 has an emitter connected to the ground line 23 via a resistor R19.

The error amplification circuit 33 compares the inverted trapezoidal wave signal Sd with the voltage applied to the resistor R11. Then, the error amplification circuit 33 controls the gate potential of MOS transistor Q11 so as to equalize the applied voltage of resistor R11 with the inverted trapezoidal wave signal Sd. The error amplification circuit 33 consists of an operational amplifier 36 and a push-pull circuit 37. The operational amplifier 36 operates in response to a booster voltage Vcp supplied from a charge-up circuit (not shown) via the power source line 35. The push-pull circuit 37 is connected between the power source line 35 and the ground line 23. The push-pull circuit 37 consists of a NPN transistor Q30 and a PNP transistor Q31.

The operational amplifier 36 has a non-inverting input terminal connected to a joint point of the resistor R11 and the drain of MOS transistor Q11. The operational amplifier 36 has an inverting input terminal connected to anoint point of the resistor R18 and the collector of transistor Q29. The operational amplifier 36 has an output terminal connected to a common base of the transistors Q30 and Q31. The transistors Q30 and Q31 have a common emitter connected to the gate of MOS transistor Q11 via a resistor R20.

When the offset voltage of operational amplifier 36 appears at the positive side, there is the possibility that a very small load current IL flows even if the trapezoidal wave signal Sb is 0V. Hence, according to this embodiment, in a differential amplification circuit (not shown) constituting an input stage of operational amplifier 36, the size of a load transistor corresponding to each input terminal is set to a unique value. Hence, the offset voltage of operational amplifier 36 surely appears at the negative side.

The saturation state detecting circuit 21 outputs the current saturation signal Sc of L level to the trapezoidal wave generating circuit 19 always when the current flowing across the electric load 12 via the MOS transistor Q11 is in a saturation state (hereinafter, referred to as current saturation state). When the MOS transistor Q11 is operating in the saturated region, the load current IL increases with increasing gate potential. When the MOS transistor Q11 comes into a linear region, the load current IL does not increase irrespective of continuous increase of gate potential. This condition that no increase of load current IL is recognized is referred to as 'current saturation state'. In this current saturation state, the upper limit current flowable via the MOS transistor Q11 within the region of ON state of MOS transistor Q11 flows across the electric load 12. When 'RL' represents a resistance value of electric load 12, the saturation current Is (i.e., current in the current saturation state) is expressed by VB/RL.

The current control circuit 20 performs feedback control for control the gate potential of MOS transistor Q11. When the current flowing across the electric load 12 via the MOS transistor Q11 enters the current saturation state, the gate-source voltage (i.e., hereinafter, referred to as gate voltage VGS) abruptly increases. The saturation state detecting circuit 21 detects the abrupt increase of gate voltage VGS. A gate voltage detecting circuit 38 detects the gate voltage VGS by subtracting the source voltage of MOS transistor Q11 from the gate voltage of MOS transistor Q11. The gate voltage detecting circuit 38 outputs the gate voltage VGS to an inverting input terminal of comparator 39. Resistors R21 and R22 are serially connected between the control power voltage Vdd and the ground line 23 to divide the control power voltage Vdd. The divided voltage (e.g., 2.5V), serving as reference voltage Vr, is entered into a non-inverting terminal of comparator 39. The comparator 39 outputs the current saturation signal Sc.

Next, operation of the electric load drive circuit 11 will be explained with reference to FIGS. 3 and 4.

Figure 3:
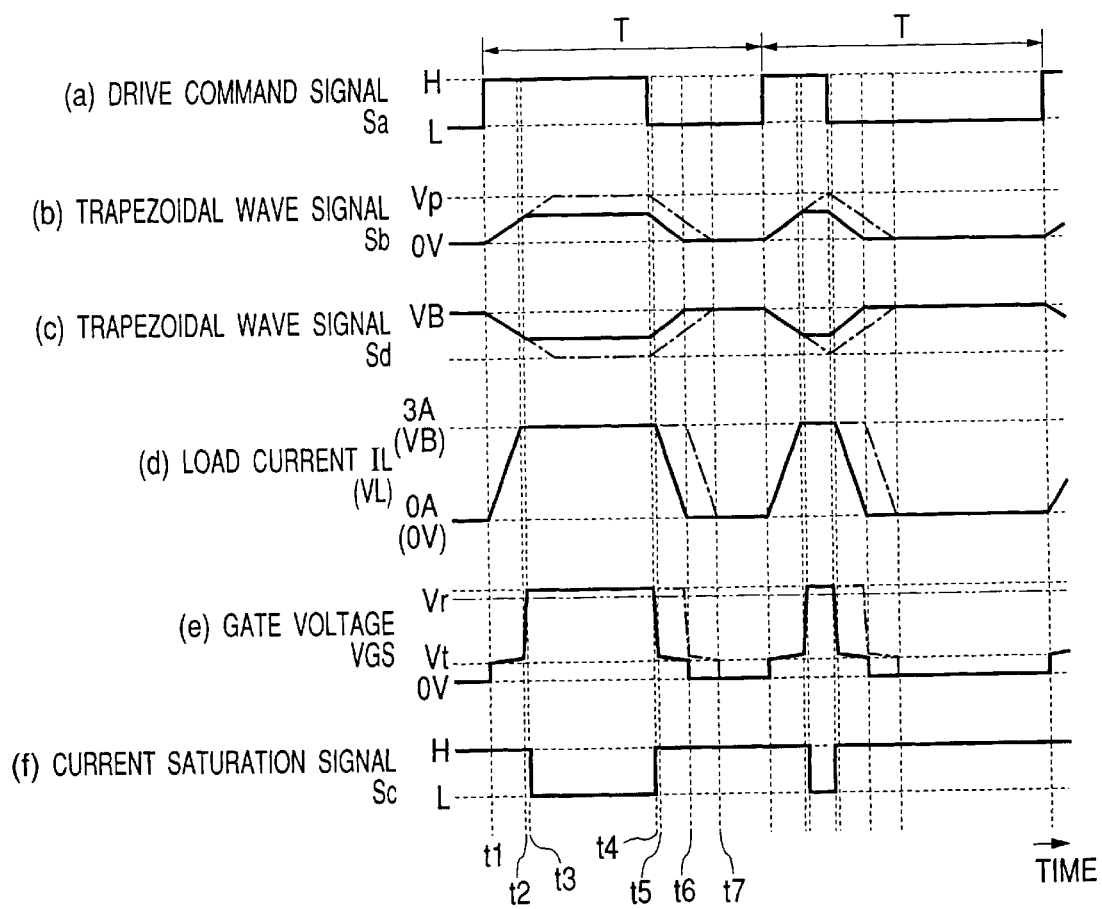
FIG. 3 is a time chart showing the waveforms of various portions in the electric load drive apparatus in the case an electric load is a lamp having a rated current of 3A.

FIG. 3 shows the waveforms of various portions in the electric load drive circuit 11 in the case the electric load 12 is a lamp having a rated current of 3A. FIG. 4 shows the waveforms of various portions in the electric load drive circuit 11 in the case the electric load 12 is a lamp having a rated current of 6A. In each case, a PWM signal having a predetermined duty ratio is entered as drive command signal Sa for controlling the brightness of lamp. The waveforms shown in FIGS. 3 and 4 are (a) drive command signal Sa, (b) trapezoidal wave signal Sb, (c) trapezoidal wave signal Sd, (d) load current IL (load voltage VL applied to electric load 12), (e) gate voltage VGS of MOS transistor Q11, and (f) current saturation signal Sc.

First, referring to FIG. 3, operation of the electric load drive circuit 11 will be explained. The drive command signal Sa is a PWM signal having a predetermined period T. In the case of FIG. 3, the duty ratio is switched to change the lamp from high brightness condition to low brightness condition. In FIG. 3, alternate long and short dash lines respectively represent the waveforms of various portions in the conventional electric load drive circuit 1 shown in FIG. 5.

(1) Before Time t1

The drive command signal Sa is of L level (corresponding to drive stop command). In the trapezoidal wave generating circuit 19, the transistor Q21 turns off while the current of 2·Ia flows from the transistors Q14 and Q15 to the transistor Q18, where Ia represents a current value produced by a serial circuit consisting of transistor Q12 and resistor R12. The current of 2·Ia serves as collector current of transistor Q19. The transistors Q18 and Q19 cooperatively constitute the current mirror circuit 28.

Meanwhile, the gate voltage VGS of MOS transistor Q11 is 0. Thus, the current saturation signal Sc of H level is produced from the saturation state detecting circuit 21. In the trapezoidal wave generating circuit 19, the transistor Q26 turns on while the transistors Q23 and Q24 turn off. The current of Ia flows into the output node n1 from transistor Q13. The current of 2·Ia flows into the transistor Q19 from the output node n1. The discharge current of Ia flows into the transistor Q19 from the capacitor C11. The discharge current becomes 0 at the time the voltage of output node n1 (i.e., trapezoidal wave signal Sb) becomes 0.

(2) From Time t1 to Time t2

The drive command signal Sa turns into H level (corresponding to drive start command) at the time t1. In the trapezoidal wave generating circuit 19, the transistor Q21 turns on while the transistors Q18 and Q19 turn off. All of the current Ia flows into the capacitor C1 from the transistor Q13. The voltage of output node n1 (i.e., trapezoidal wave signal Sb) substantially increases at a constant gradient.

The current control circuit 20 controls the gate potential (i.e., gate voltage VGS) of MOS transistor Q11 so as to equalize the voltage applied to resistor R11 with the trapezoidal wave signal Sd. The trapezoidal wave signal Sd has an inverse shape of the trapezoidal wave signal Sb. The load current IL linearly increases in accordance with the trapezoidal wave signal Sb. The gate voltage VGS steps up at the time t1 by an amount of threshold voltage Vt of MOS transistor Q11.

(3) From Time t2 to Time t3

The load current IL increases in accordance with the trapezoidal wave signal Sb and then enters into the above-described current saturation state at time t2. Thus, the load current IL stops increasing irrespective of continuous increase of trapezoidal wave signal Sb. In this case, the voltage applied to resistor R11 deviates from the trapezoidal wave signal Sd. Thus, the output voltage of operational amplifier 36, i.e., the gate potential of MOS transistor Q11, abruptly increases. The gate voltage VGS exceeds the reference voltage Vr (shown by an alternate long and two short dashes line) at the time t3. Thus, in the saturation state detecting circuit 21, the output voltage of comparator 39 is reversed. The current saturation signal Sc changes from H level to L level. The time duration from t2 to t3, corresponding to the operational time lag of operational amplifier 36 and comparator 39, is very short.

(4) From Time t3 to Time t4

The current saturation signal Sc becomes L level at time t3. In the trapezoidal wave generating circuit 19, the transistor Q26 turns off while the current of 2·Ia flows from transistors Q16 and Q17 to the transistor Q23. The current of 2·Ia serves as collector current of transistor Q24. The transistors Q23 and Q24 cooperatively constitute the current mirror circuit 29. All of the current Ia flows into the transistor Q24 from the transistor Q13. The charge/discharge current of capacitor C11 becomes 0. The voltage of output node n1 (i.e., trapezoidal wave signal Sb) is maintained at a constant value (i.e., holding voltage). The holding voltage is an upper edge voltage of trapezoidal wave signal Sb. The above-described saturation current Is continuously flows across electric load 12. In the case of conventional electric load drive circuit 1 shown in FIG. 5, the trapezoidal wave signal Sb increases until it reaches a predetermined upper edge voltage Vp even in the current saturation state.

(5) From Time t4 to Time t5

The drive command signal Sa turns into L level at time t4. In the trapezoidal wave generating circuit 19, transistor Q21 turns off while transistors Q18 and Q19 turn on. The discharge current of 2·Ia flows into transistor Q19 from capacitor C11. Hence, the voltage of output node n1 (i.e., trapezoidal wave signal Sb) decreases. Correspondingly, the current control circuit 20 decreases the gate potential of MOS transistor Q11.

Subsequently, exiting out of the current saturation state at time t5, the gate voltage VGS falls below the reference voltage Vr. The output voltage of comparator 39 is reversed in the saturation state detecting circuit 21. The current saturation signal Sc changes from L level to H level. The time duration from t4 to t5, corresponding to the operational time lag of operational amplifier 36 and comparator 39, is very short.

(6) From Time t5 to Time t6

The current saturation signal Sc turns into H level at time t5. In the trapezoidal wave generating circuit 19, transistor Q26 turns on while transistors Q23 and Q24 turn off. Hence, the discharge current of Ia flows into transistor Q19 from capacitor C11. The voltage of output node n1 (i.e., trapezoidal wave signal Sb) decreases at a constant gradient until it becomes 0V. The load current IL linearly decrees in accordance with the trapezoidal wave signal Sb. The trapezoidal wave signal Sb becomes 0 V at time t6. The gate voltage VGS steps down at the time t6 by an amount of threshold voltage Vt of MOS transistor Q11. In the case of conventional electric load drive circuit 1 shown in FIG. 5, the load current IL starts decreasing with a time lag after the trapezoidal wave signal Sb starts decreasing.

The above-described operations of (1) through (6) are established irrespective of the duty ratio of drive command signal Sa or impedance of electric load 12.

Figure 4:
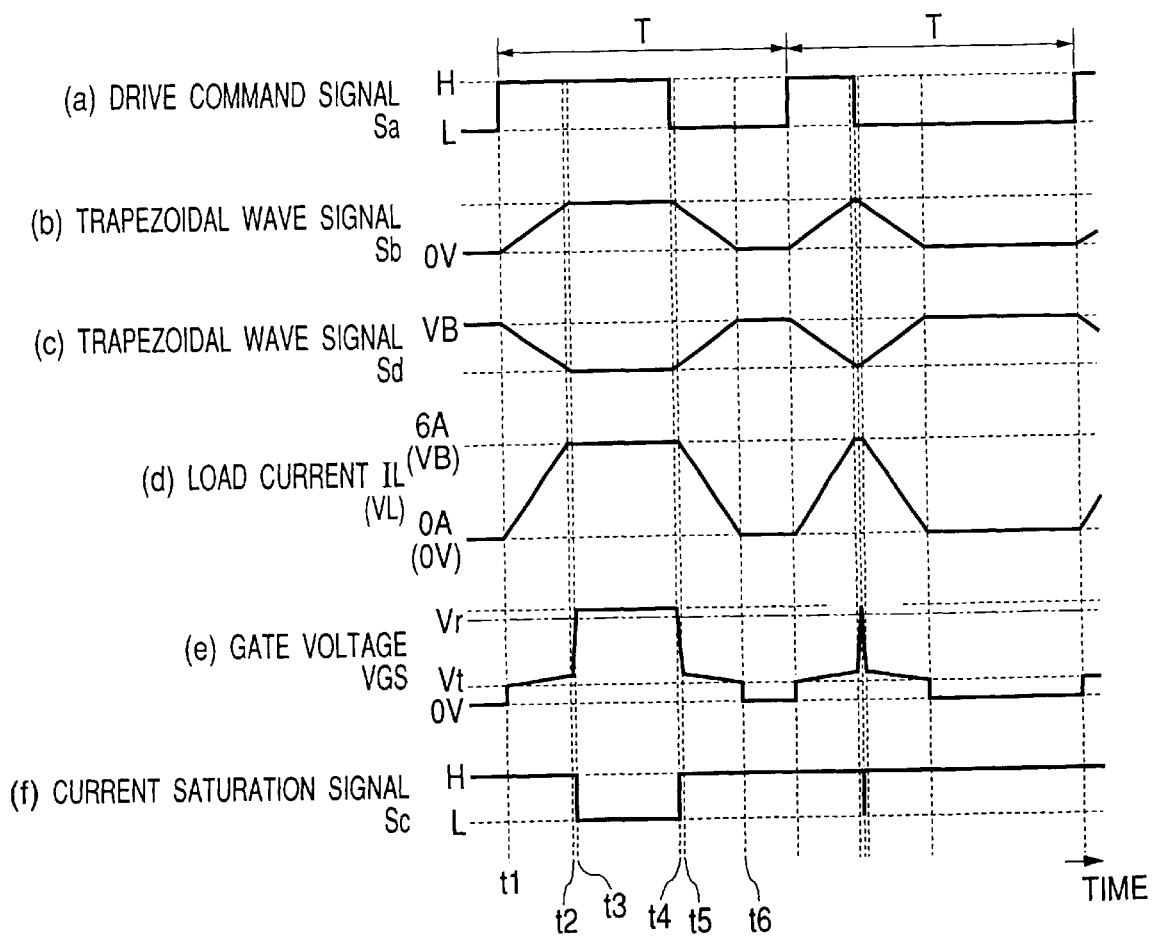
FIG. 4 is a time chart showing the waveforms of various portions in the electric load drive apparatus in the case the electric load is a lamp having a rated current of 6A.

FIG. 4 shows the waveforms of various portions in the electric load drive circuit 11 in the case the electric load 12 is a lamp having a rated current of 6A. In FIG. 4, the gradients of trapezoidal wave signal Sb in respective terms t1–t3 and t4–t6 are identical with those of the trapezoidal wave signal Sb shown in FIG. 3. Furthermore, the load current IL shown in FIG. 4 increases and decreases with the same rates as those of the load current IL shown in FIG. 3. In this case, the gradient of load voltage VL applied to electric load 12 becomes a half of that shown in FIG. 3. The time required for the load voltage VL to reach the saturation level VB, i.e., time duration from t1 to t2, becomes long. Meanwhile, the trapezoidal wave signal Sb continuously increases until it reaches the current saturation state. Thus, the upper edge voltage of trapezoidal wave signal Sb becomes twice as large as that of FIG. 3.

As explained above, when the drive command signal Sa becomes H level to start activation of electric load 12, the trapezoidal wave signal Sb commanding the load current IL continuously increases at substantially constant gradient until the load current IL reaches the current saturation state. The trapezoidal wave signal Sb is held at a momentary voltage value when the load current IL is saturated. In other words, according to the electric load drive circuit 11 of this embodiment, the upper edge voltage of trapezoidal wave signal Sb is not controlled to a constant value. Instead, the electric load drive circuit 11 of this embodiment controls the upper edge voltage of trapezoidal wave signal Sb to a value corresponding to the saturation current Is.

As a result, it becomes possible to prevent the trapezoidal wave signal Sb from generating a command exceeding the saturation current Is. When the drive command signal Sa turns into L level, the trapezoidal wave signal Sb starts decreasing from the upper edge voltage. The load current IL immediately starts decreasing in accordance with the trapezoidal wave signal Sb. In this manner, by using the electric load drive circuit 11 of this embodiment, it becomes possible that the electric load 12 always receives the current corresponding to the trapezoidal wave signal Sb irrespective of the battery voltage VB and the impedance of electric load 12. Thus, the current supply time commanded by drive command signal Sa is accurately equalized with the effective current supply time of load current IL. In this case, a current supply threshold is, for example, set to a mid level of an amplitude of load current IL.

Accordingly, when the drive command signal Sa (a PWM signal) is given to adjust the brightness of a lamp (i.e., electric load 12), the effective duty ratio of trapezoidal load current IL is always equalized with a duty ratio of drive command signal Sa. As a result, it becomes possible to accurately adjust the brightness of a lamp to a commanded value irrespective of change of the rated current (i.e., impedance) and battery voltage VB.

Furthermore, the saturation state detecting circuit 21 detects the increase of gate voltage VGS of MOS transistor Q11 under the feedback control by the current control circuit 20. Accordingly, the saturation state detecting circuit 21 can accurately control the current saturation state even when the battery voltage VB varies.

According to the above-described embodiment of this invention, the trapezoidal wave signal Sb continuously increases until the it reaches the current saturation state. For example, when the battery voltage VB is excessively enlarged, or when the impedance of electric load 12 is excessively small, the saturation current Is may increase so largely. Hence, the above-described embodiment of this invention provides the voltage limit current 30 in the trapezoidal wave generating circuit 19. The voltage limit current 30 limits the upper edge voltage of trapezoidal wave signal Sb to a value corresponding to an excessive current protection level. Accordingly, it becomes possible to protect MOS transistor Q11 or electric load 12 against excessive current.

The lamp has an impedance (i.e., resistance value) varying due to heat generation corresponding to supplied electric power. In the beginning of operation, the lamp has a relatively small resistance value hence, if a stepwise drive voltage is applied to the lamp, an excessively large current will flow across the electric load. On the other hand, according to the above-described embodiment of the present invention, the lamp receives a trapezoidal current corresponding to trapezoidal wave signal Sb. This effectively prevents the load current IL from becoming so excessively in the beginning of operation. Thus, it becomes possible to effectively suppress generation of noise even when load current IL changes abruptly. As a result, it becomes possible to reduce the noise giving adverse influence to a car radio or to other control devices installed in an automotive vehicle. The radio noise reduces. Other control devices can operate stably. The life of a lamp becomes long.

As apparent from the foregoing description, the first embodiment of the present invention provides an electric load drive apparatus comprising:

a switching element (Q11) provided in an electric power supply path extending from a direct-current power source (13) to an electric load (12);

a detecting resistor (R11), connected in series with the switching element (Q11), for detecting a voltage value (VL) representing a load current (IL) flowing across the electric load (12) via the switching element (Q11);

a saturation state detecting section (21) for outputting a current saturation signal (Sc) during a term an upper limit current flows across the electric load (12), the upper limit current being a maximum current flowable via the switching element (Q11) in an open/close controllable range of the switching element (Q11);

a signal generating section (19) for producing a trapezoidal wave signal (Sb) whose voltage value starts changing in accordance with increase of the load current (IL) when a drive start command signal (Sa-H) is entered, stops changing in response to the output of the current saturation signal (Sc) generated from the saturation state detecting section (21), and then starts changing in accordance with decrease of the load current (IL) when a drive stop command signal (Sa-L) is entered, and a current control section (20) for comparing the trapezoidal wave signal (Sb) produced from the signal generating section (19) with the voltage value detected by the detecting resistor (R11) and then controlling the switching element (Q11) based on the trapezoidal wave signal in such a manner a trapezoidal wave current (IL) flows across the electric load (12).

The switching element is constituted by a transistor (Q11) capable of controlling the load current in accordance with an input voltage entered to a control terminal thereof. The current control section (20) comprises an operational amplifier (34) outputting a voltage corresponding to a potential difference between the trapezoidal wave signal (Sb) produced from the signal generating section (19) and the voltage value detected by the detecting resistor (R11). And, the current control section (20) controls the input voltage supplied to the control terminal of the transistor (Q11) in accordance with the output voltage of the operational amplifier.

The saturation state detecting section (21) comprises a comparator (39) comparing a control voltage (VGS) of the transistor (Q11) with a predetermined reference voltage (Vr).

The signal generating section (19) comprises a capacitor (C11) outputting the trapezoidal wave signal (Sb), a first constant-current circuit (25) connected in series with the capacitor (C11), a second constant-current circuit (26) connected in parallel with the capacitor (C11) to perform a constant-current operation during a term the drive stop command signal (Sa-L) is entered, and a third constant-current circuit (27) connected in series with the first constant-current circuit (25) to input an output current of the first constant-current circuit during a term the saturation state detecting section outputs the current saturation signal (Sc).

The signal generating section (19) comprises a limit circuit (30) for suppressing a voltage applied to the capacitor (C11) within a predetermined voltage.

Each of the drive start command signal (Sa-H) and the drive stop command signal (Sa-L) is a PWM signal having a duty ratio corresponding to the load current.

The embodiment of the present invention is not limited to the disclosed one. Accordingly, the embodiment of the present invention can be modified in the following manner.

For example, MOS transistor Q11 can be interposed between the electric load 12 and the ground line. In this case, MOS transistor Q11 can function as a low side switch. It is preferable that resistor R11 is interposed between MOS transistor Q11 and the ground line. This is effective to simplify the circuit arrangement for detecting a voltage value representing the load current IL in the current control circuit 20 in the same manner as in the above-described embodiment.

Furthermore, it is possible to use a bipolar transistor or IGBT for switching element.

Furthermore, the above-described trapezoidal wave generating circuit 19 has a serial circuit consisting of transistor Q12 and resistor R12 to generate the current of Ia. However, it is possible to employ a self-bias type constant-current circuit to suppress current fluctuation caused by battery voltage VB.

Second Embodiment

Figure 7:
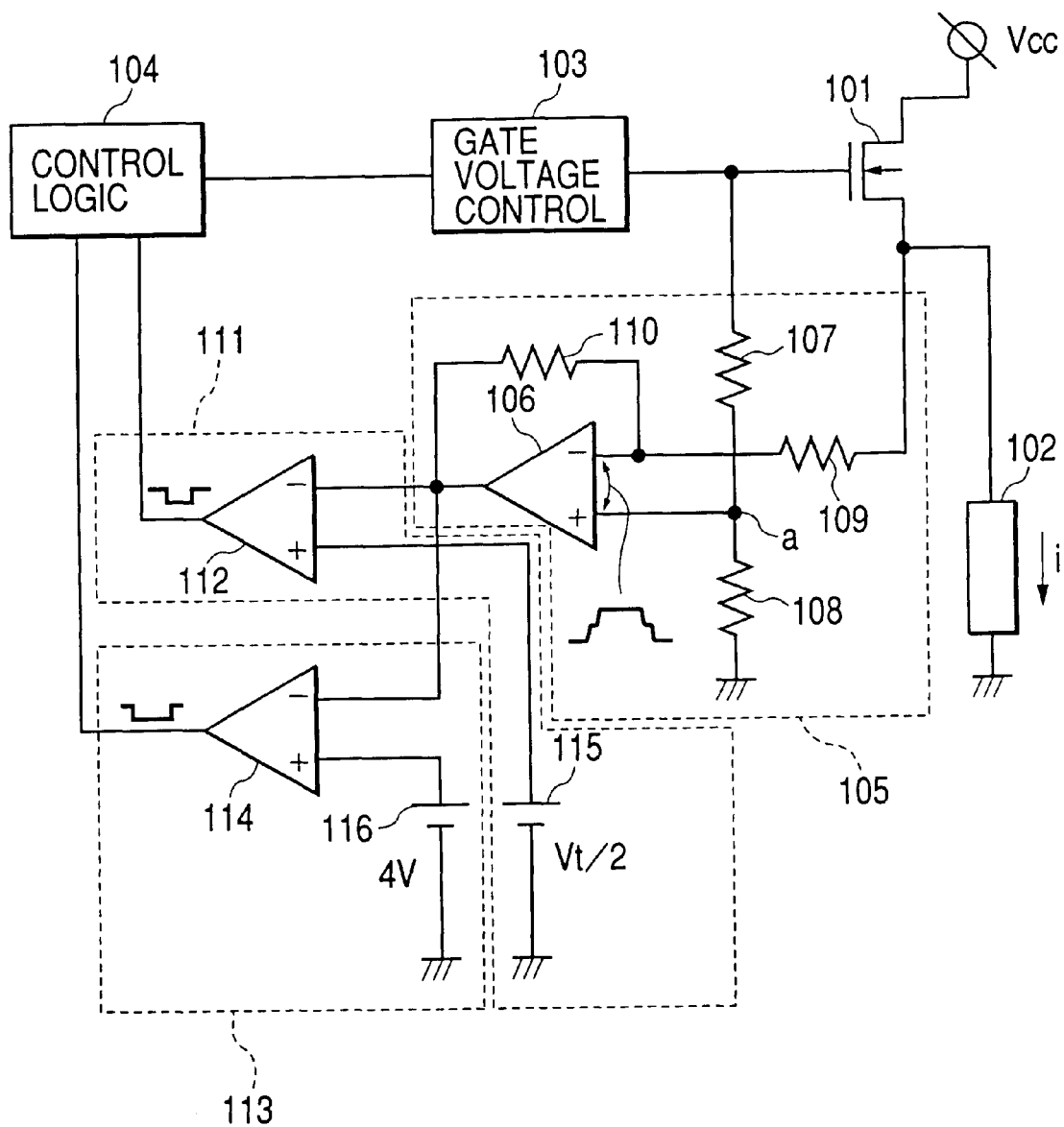
FIG. 7 is a circuit diagram showing the arrangement of a control apparatus for a power MOS transistor in accordance with a second embodiment of the present invention.

FIG. 7 shows a circuit arrangement of a power MOS transistor in accordance with a second embodiment of the present invention.

As shown in FIG. 7, a power MOS transistor 101 and an electric load 102 are connected in series between a power source Vcc and the ground. The electric load 102 is a lamp. A gate voltage control circuit 103 is connected to a gate terminal of power MOS transistor 101. A control logic circuit 104 is connected to the gate voltage control circuit 103. The gate voltage control circuit 103 produces a trapezoidal wave signal in response to a command sent from the control logic circuit 104. The trapezoidal wave signal is entered into the gate terminal of power MOS transistor 101. The power MOS transistor 101 is PWM controlled in accordance with the received trapezoidal wave signal. A current 'i', adjusted by the PWM control, flows across the electric load 102.

Figure 8:
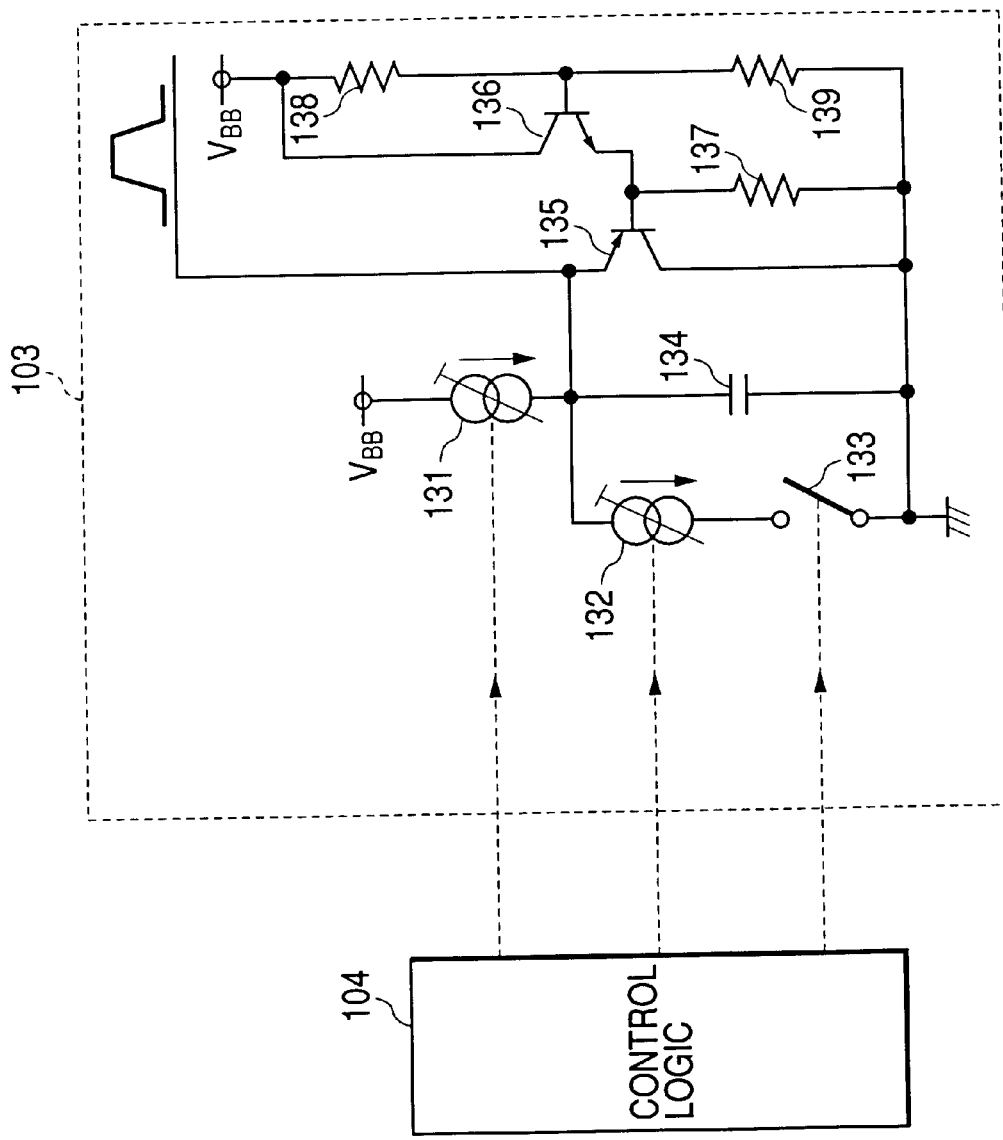
FIG. 8 is a circuit diagram showing the arrangement of a gate voltage control circuit shown in FIG. 7.

FIG. 8 shows the detailed arrangement of gate voltage control circuit 103. The gate voltage control circuit 103 comprises constant-current circuits 131 and 132, a switch 133, a capacitor 134, bipolar transistors 135 and 136, and resistors 137, 138 and 139. When the electric load (i.e., lamp) is activated, the switch 133 is opened. Furthermore, transistor 136 is turned on. The constant-current circuit 131 charges the capacitor 134. The transistor 135 is turned on by the charging of capacitor 134. When the electric load is deactivated, the switch 133 is closed. The capacitor 134 starts discharging through the constant-current circuit 132. In this case, the waveform of the discharge current has a trailing edge of a predetermined gradient. Then, the transistor 135 turns into an OFF state. Meanwhile, when the electric load is activated after the capacitor 134 is discharged, the switch 133 is opened. The constant-current circuit 131 charges the capacitor 134. In this case, the waveform of the charge current has a build-up edge of a predetermined gradient. Then, the transistor 135 turns into an ON state. In this manner, the control signal (i.e., control voltage) having a trapezoidal waveform is produced from the gate voltage control circuit 103.

Returning to FIG. 7, a gate-source voltage detecting circuit 105 is connected between the gate terminal and the source terminal of power MOS transistor 101. The gate-source voltage detecting circuit 105 detects a gate-source voltage Vgs of power MOS transistor 101 when the control voltage is applied to the gate terminal of power MOS transistor 101.

The gate-source voltage detecting circuit 105 consists of a differential amplifier 106 and resistors 107, 108, 109 and 110. More specifically, the resistors 107 and 108 are serially connected between the gate terminal of power MOS transistor 101 and the ground. Anoint point 'a' of resistors 107 and 108 is connected to a non-inverting input terminal of differential amplifier 106. An inverting input terminal of differential amplifier 106 is connected to the source terminal of power MOS transistor 101 via the resistor 109. An output terminal of differential amplifier 106 is connected to the inverting input terminal of differential amplifier 106 via resistor 110 do as to provide negative feedback. The differential amplifier 106 amplifies a difference between a gate voltage and a source voltage of power MOS transistor 101.

Furthermore, the output terminal of differential amplifier 106 is connected to an inverting input terminal of comparator 112 in a voltage detecting circuit 111 and is also connected to an inverting input terminal of comparator 114 in a voltage detecting circuit 113. A reference power source 115 is connected to a non-inverting input terminal of comparator 112. A reference power source 116 is connected to a non-inverting input terminal of comparator 114. The voltage value of reference power source 115 serves as a comparing value for the gate-source voltage Vgs. The comparing value is equivalent to a half of threshold voltage Vt (Vgs=Vt/2). The voltage value of reference power source 116, serving as a comparing value for the gate-source voltage Vgs, is set to 4 volts.

Furthermore, output terminals of comparators 112 and 114 are connected to the control logic circuit 104.

Next, the above-described control apparatus for a power MOS transistor operates in the following manner.

Figure 9:
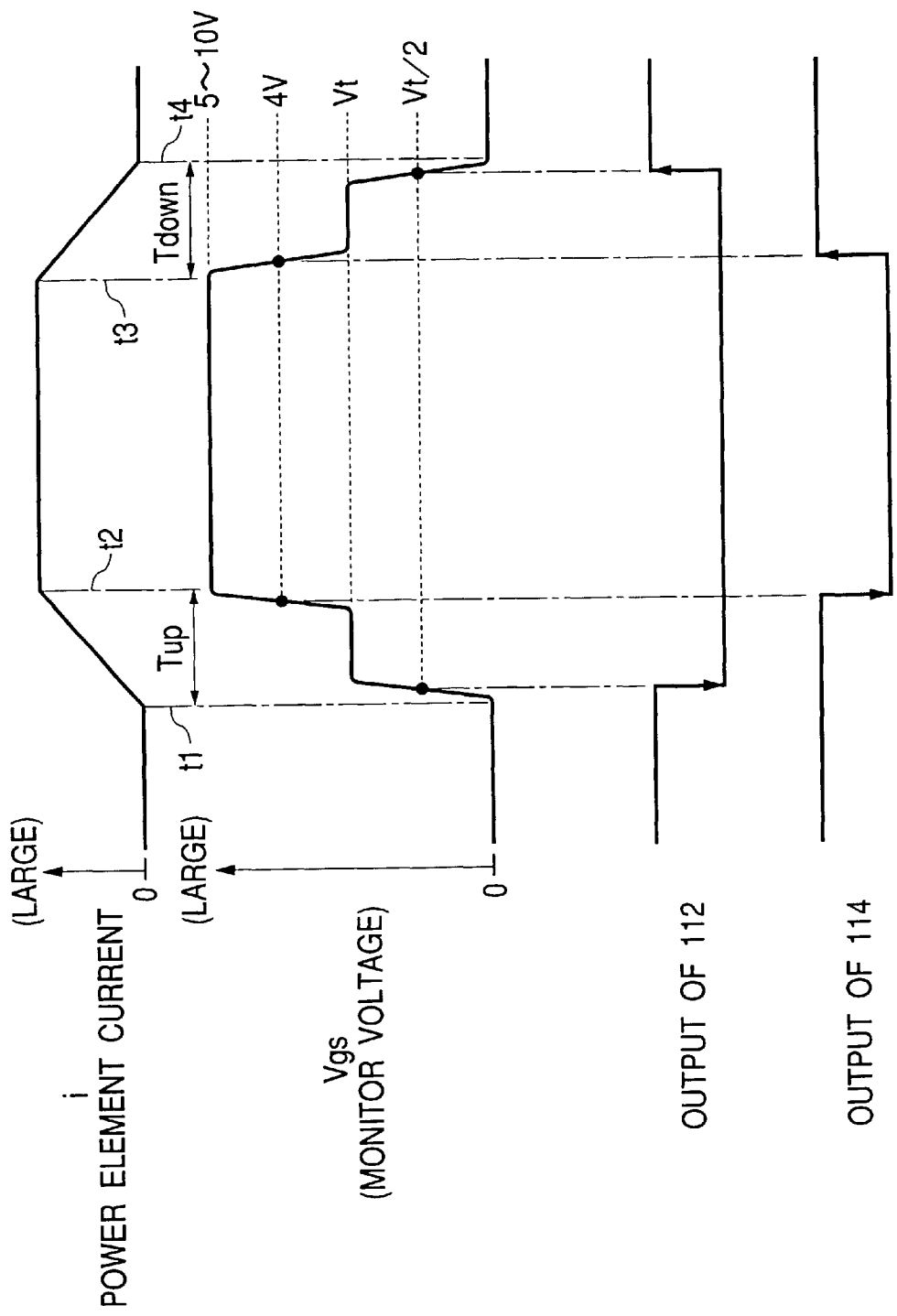
FIG. 9 is a time chart explaining the operation of the control apparatus shown in FIG. 7.

FIG. 9 is a time chart explaining the operation of the control apparatus for a power MOS transistor in accordance with the second embodiment of the present invention. FIG. 9 shows the power MOS transistor current 'i', the gate-source voltage Vgs, and outputs of respective comparators 112 and 114.

The control logic circuit 104 applies the control voltage to the gate terminal of power MOS transistor 101 via the gate voltage control circuit 103, thereby causing the trapezoidal pulse current 'i' to flow across the electric load 102 as shown in FIG. 9. More specifically, the trapezoidal pulse current 'i' has a waveform having a build-up edge of a predetermined gradient at term t1–t2 and a trailing edge of a predetermined gradient at term t3–t4. In this case, the power MOS transistor 101 is turned off until time t1 has passed. Hence, in FIG. 9, the gate-source voltage Vgs is held at 0 V until time t1 has passed. When the gradient of current 'i' is controlled in each of terms t1–t2 and t3–t4, the gate-source voltage Vgs is in the vicinity of threshold voltage Vt of power MOS transistor 101. In respective terms t1–t2 and t3–t4, the power MOS transistor 101 operates in the saturation region. The gate-source voltage is small, while the drain-source voltage is large. Furthermore, in FIG. 9, term t2–t3 corresponds to ON-state of power MOS transistor 101 where the gate-source voltage Vgs becomes large as much as 5 V to 10 V. During the term the current is constant, the power MOS transistor 101 operates in the linear region (i.e., in a non-saturation region). The gate-source voltage is large, while the drain-source voltage is small.

Figure 10:
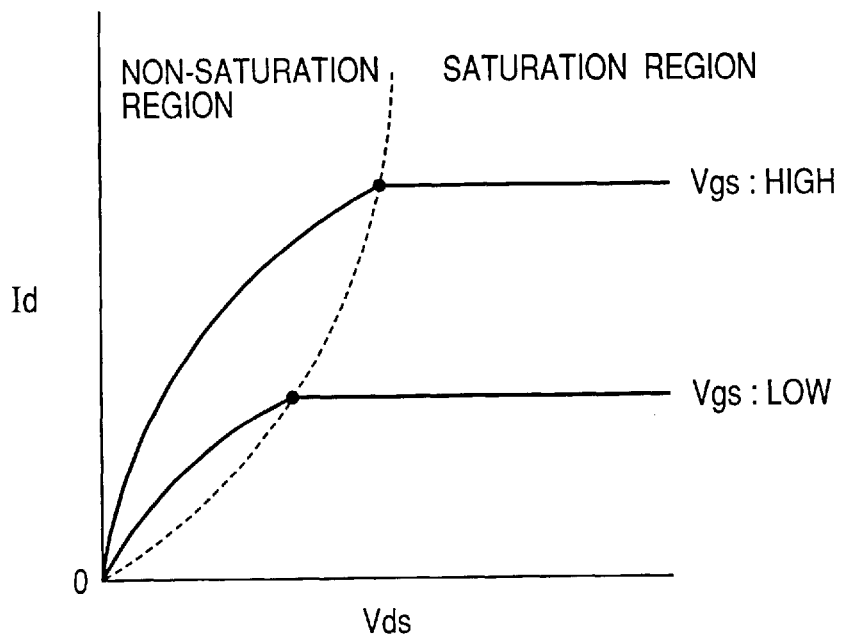
FIG. 10 is a graph showing transistor characteristics.

The differential amplifier 106 sown in FIG. 7 amplifies the gate-source voltage Vgs. In the voltage detecting circuit 111, the comparator 112 compares the gate-source voltage Vgs with a half of threshold Vt (=Vt/2). In the voltage detecting circuit 113, the comparator 114 compares the gate-source voltage Vgs with 4V. Through the comparison in the voltage detecting circuit 111 (comparator 112) and in the voltage detecting circuit 113 (comparator 114), it is possible to judge whether the power MOS transistor operates in the saturation region or in the non-saturation region shown in FIG. 10. With this arrangement, the control logic circuit 104 detects the durations Tup and Tdown shown in FIG. 9.

More specifically, the rise time Tup is a term for controlling the current gradient to turn on the power MOS transistor 101. The rise time Tup is regarded as substantially equivalent to a duration from Vt/2 to 4V in the ascending stage of gate-source voltage Vgs. The voltage level of 4V is a mid value of a sufficient gate-source voltage for turning on the power MOSFET transistor 101. Similarly, the fall time Tdown is a term for controlling the current gradient to turn off the power MOS transistor 101. The fall time Tdown is regarded as substantially equivalent to a duration from 4V and Vt/2 in the descending stage of gate-source voltage Vgs.

In this manner, the rise time Tup and the fall time Tdown of the waveform of the present load current flowing across the electric load 102 are obtained by measuring the duration of the saturation region in the transistor characteristics. More specifically, the voltage detecting circuit 111, serving as first comparing section, compares the detected gate-source voltage Vgs with a first judgement value being set between an OFF voltage and the threshold voltage. The voltage detecting circuit 113, serving as second comparing section, compares the detected gate-source voltage Vgs with a second judgement value being set between an ON voltage and the threshold voltage. The control logic circuit 104, serving as time measuring section, measures elapse of time between the first judgement value and the second judgement value based on comparing results obtained by two voltage detecting circuits 111 and 113. The control logic circuit 104 designates the measured time elapse as the duration of the saturation region in the transistor characteristics. With this arrangement, it becomes possible to easily detect the rise time Tup and the fall time Tdown.

Furthermore, the control logic circuit 104, serving as feedback section, obtains deviations of rise time Tup and fall time Tdown of a present load current waveform with respect to their target values, and performs feedback control of the power MOS transistor 101 so as to eliminate the obtained deviations of rise time Tup and fall time Tdown.

Figure 11:
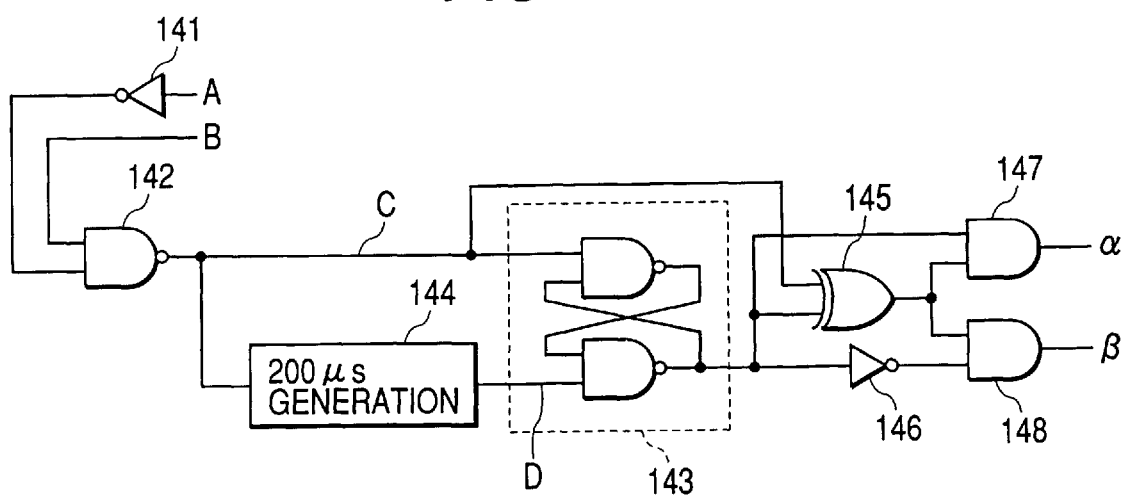
FIG. 11 is a circuit diagram showing an example of time measuring arrangement of a control logic circuit shown in FIG. 7.
Figure 12:
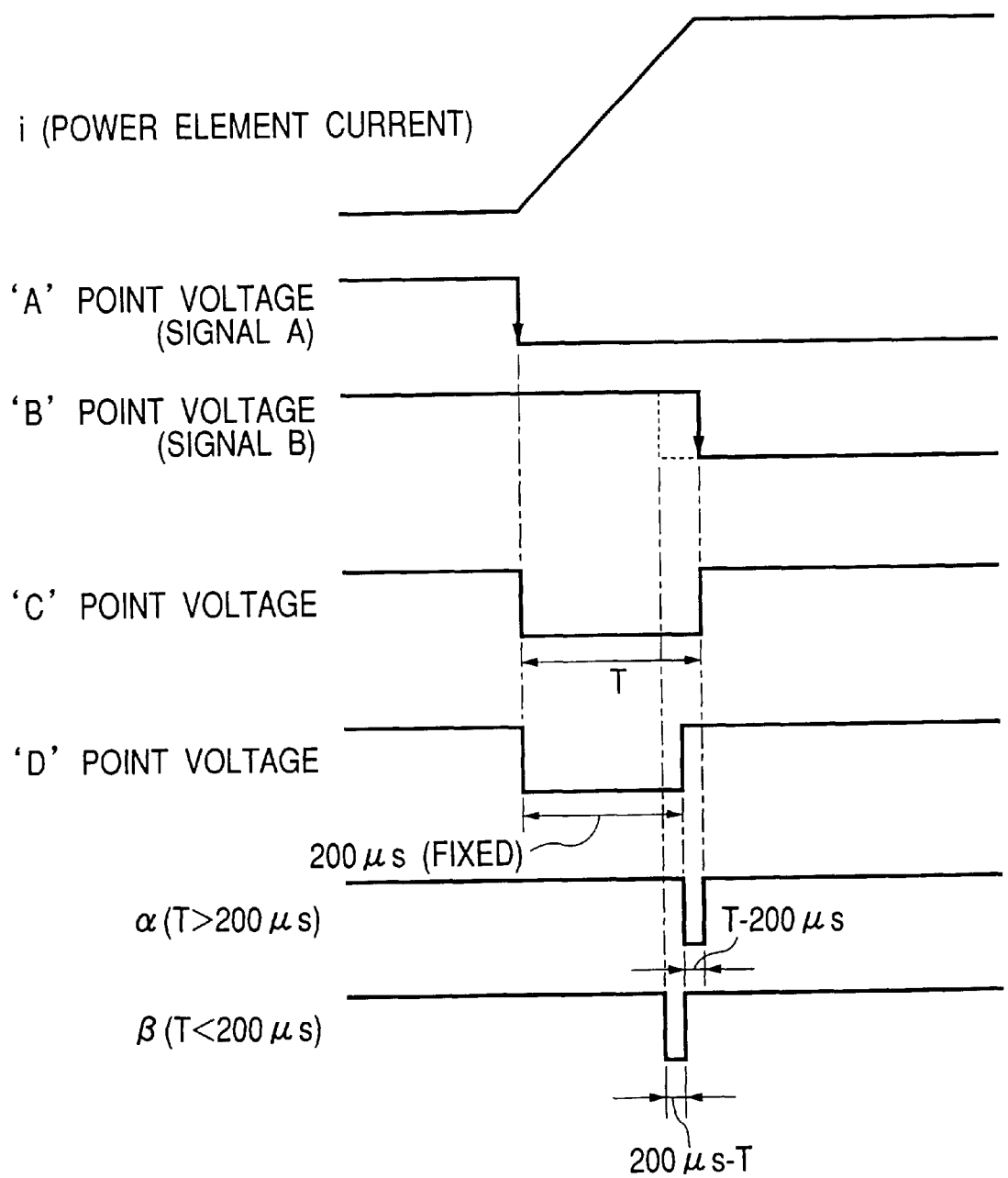
FIG. 12 is a time chart explaining the operation of the time measuring arrangement shown in FIG. 11.

FIG. 11 shows an example of a time measuring arrangement of the control logic circuit 104 shown in FIG. 7. FIG. 12 is a time chart explaining the operation of this time measuring arrangement in the control logic circuit 104.

In FIG. 11, an output signal A of voltage detecting circuit 111 is entered into NAND gate 142 via inverter 141. An output signal B of voltage detecting circuit 113 is also entered into NAND gate 142 via inverter 141. An output signal of NAND gate 142 is directly entered into NAND latch circuit 143 and is also entered via 200 $\mu$s generating circuit 144 into NAND latch circuit 143. Furthermore, an output signal of NAND latch circuit 143 is entered into AND gate 148 via inverter 146. Meanwhile, the output signal of NAND latch circuit 143 is entered into exclusive OR circuit 145 and is also entered into AND gate 147. Furthermore, an output signal of NAND gate 142 is entered into exclusive OR circuit 145. An output signal of exclusive OR circuit 145 is entered into AND gate 147 and is also entered into AND gate 148. An output of AND gate 147 is produced as $\alpha$ signal. An output of AND gate 148 is produced as $\beta$ signal According to the above-described circuit arrangement, as shown in FIG. 12, an output (i.e., C point voltage) of NAND gate 142 is L level during a term from falling of signal A to falling of signal B. In synchronism with falling of output of NAND gate 142 (=falling of signal A), the 200 $\mu$sec generating circuit 144 generates a pulse of 200 $\mu$sec which serves as reference time (refer to D point voltage). This pulse signal is sent to NAND latch circuit 143. When time T from falling of signal A to falling of signal B is longer than 200 $\mu$sec, $\alpha$ signal of L level is produced. On the other hand, when time T is shorter than 200 $\mu$sec, $\beta$ signal of L level is produced.

The durations of L level in $\alpha$ signal and $\beta$ signal reflect deviations between rise time Tup and fall time Tdown in the present load current waveform and their target values. The gate voltage control circuit 103 use these $\alpha$ and $\beta$ signals to control the currents flowing in constant-current circuits 131 and 132. And, the gate voltage control circuit 103 performs feedback control of power MOS transistor 101 in such a manner that rise time Tup and fall time Tdown are equalized with the reference time (=200 $\mu$sec). More specifically, the currents flowing across respective constant-current circuits 131 and 132 are increased or decreased in accordance with the durations of L level in $\alpha$ and $\beta$ signals. Namely, the charging or discharging speed of capacitor 134 is changed. When the rise time Tup and the fall time Tdown are shorter than the reference time (=200 $\mu$sec), the gate voltage control circuit 103 produces an output so as to reduce the gradient of current. On the other hand, when the rise time Tup and the fall time Tdown are longer than the reference time (=200 $\mu$sec), the gate voltage control circuit 103 produces an output so as to increase the gradient of current.

Figure 13:
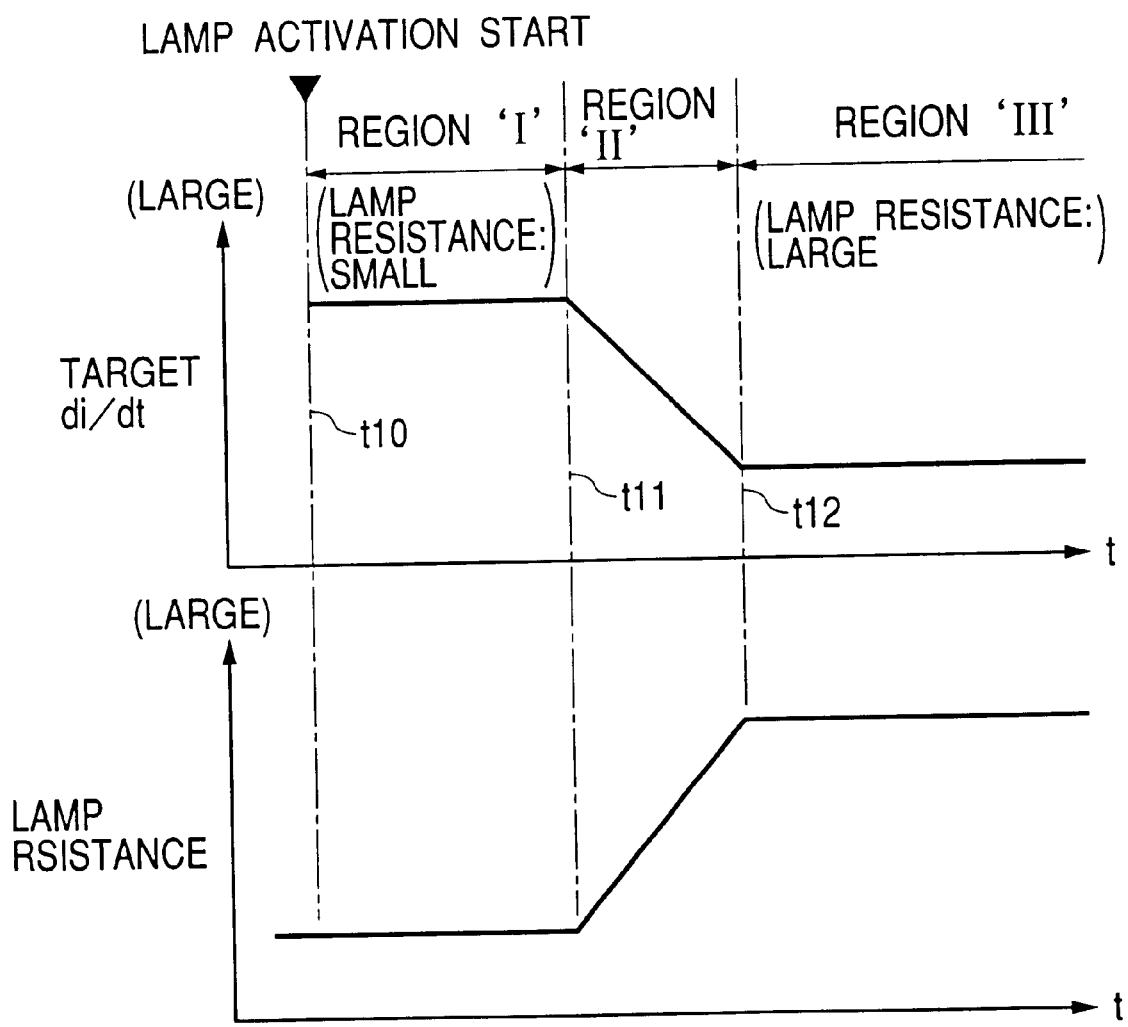
FIG. 13 is a time chart showing the load current control of a lamp in accordance with the second embodiment of the present invention.
Figure 14:
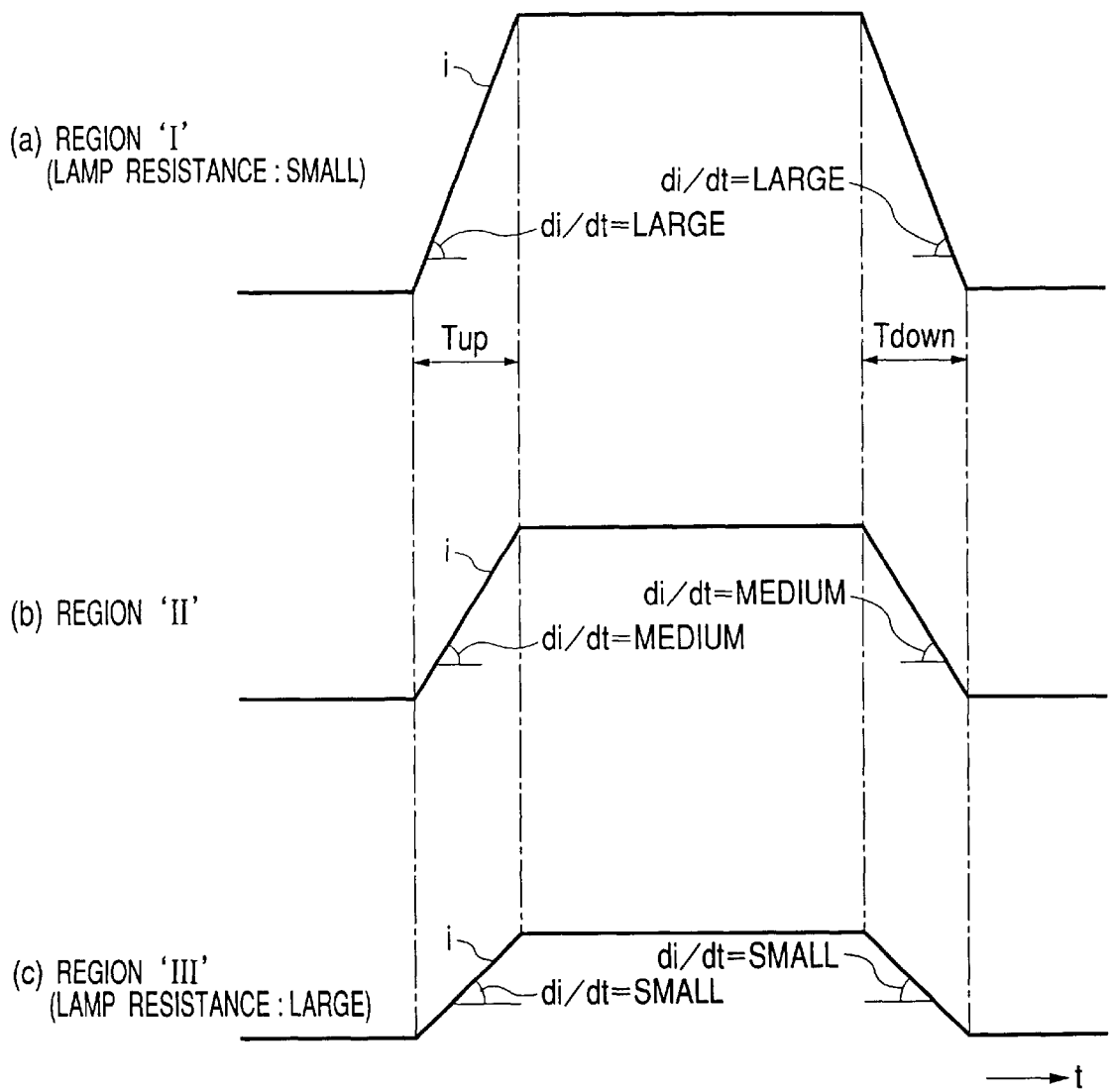
FIG. 14 is a time chart showing the setting of a trapezoidal control signal applied to a power MOS transistor in accordance with the second embodiment of the present invention.

More specifically, when the electric load 102 is a lamp, the lamp is activated at time t10 as shown in FIG. 13. The lamp resistance is small during a term t10–t11. During this term t10–t11, as shown in FIG. 14(*a*), the current change di/dt is set to be a large value. Furthermore, the lamp resistance becomes large after time t12. After time t12, as shown in FIG. 14(*c*), the current change di/dt is set to be a small value. Furthermore, in a transitional term t11–t12, the current change di/dt is set to be a medium value.

As a result, in each of region I (where the lamp resistance is small), region II (where the lamp resistance is medium), and region III (where the lamp resistance is large), control of rise and fall times is performed during the same time. In this case, in the region I (where the lamp resistance is small), noise and heat generation can be suppressed properly by suppressing 'di/dt' below a predetermined value. Furthermore, in the region III (where the lamp resistance is large), noise can be further reduced because 'di/dt' is small. No heat generation problem will be caused. Furthermore, in the region II (where the lamp resistance is medium), noise can be also suppressed because 'di/dt' is medium.

Through the above-described feedback control of power MOS transistor 101, rise time Tup and fall time Tdown are equalized to constant values.

According to the above-described control apparatus, rise time Tup and fall time Tdown can be controlled to desired values even when the power source voltage (Vcc) fluctuates.

Moreover, as the threshold voltage of power MOS transistor varies depending on temperature, it is preferable to monitor the temperature of power MOS transistor and measure the rise time Tup and fall time Tdown based on the threshold voltage corresponding to the monitored temperature. In other words, it is preferable to perform temperature compensation for the threshold Vt.

As apparent from the foregoing description, the second embodiment of the present invention provides a control apparatus for a power MOS transistor comprising:

a power MOS transistor (101) interposed between an electric load (102) and a power source (Vcc) for causing a trapezoidal pulse current to flow across the electric load (102) when a control voltage is applied to a gate terminal of the power MOS transistor (101);

a gate-source voltage detecting section (105) for detecting a gate-source voltage (Vgs) of the power MOS transistor (101) when the control voltage is applied to the gate terminal of the power MOS transistor (101);

a feedback section (104) for obtaining deviations of rise time and fall time (Tup, Tdown) of a present load current waveform with respect to their target values based on the gate-source voltage (Vgs) of the power MOS transistor (101) detected by the gate-source voltage detecting section (105), and for performing feedback control of the power MOS transistor so as to eliminate the deviations of rise time (Tup) and fall time (Tdown).

The rise time (Tup) and the fall time (Tdown) of the present load current waveform are obtained by measuring the duration of a saturation region in the transistor characteristics.

The control apparatus for a power MOS transistor further comprising:

a first comparing section (111) for comparing the detected gate-source voltage (Vgs) with a first judgement value (Vt/2) being set between an OFF voltage and a threshold voltage (Vt);

a second comparing section (113) for comparing the detected gate-source voltage (Vgs) with a second judgement value (4V) being set between an ON voltage and the threshold voltage (Vt); and a time measuring section (104) for measuring elapse of time between the first judgement value (Vt/2) and the second judgement value (4V) based on comparing results obtained by the first comparing section (111) and the second comparing section (113) and designating the measured time elapse as the duration of the saturation region in the transistor characteristics.

The feedback control of the power MOS transistor (101) is performed in such a manner that the rise time (Tup) and the fall time (Tdown) become constant.

The electric load (102) is a lamp.

Third Embodiment

A third embodiment of the present invention will be explained with reference to FIGS. 15 to 17.

Figure 15:
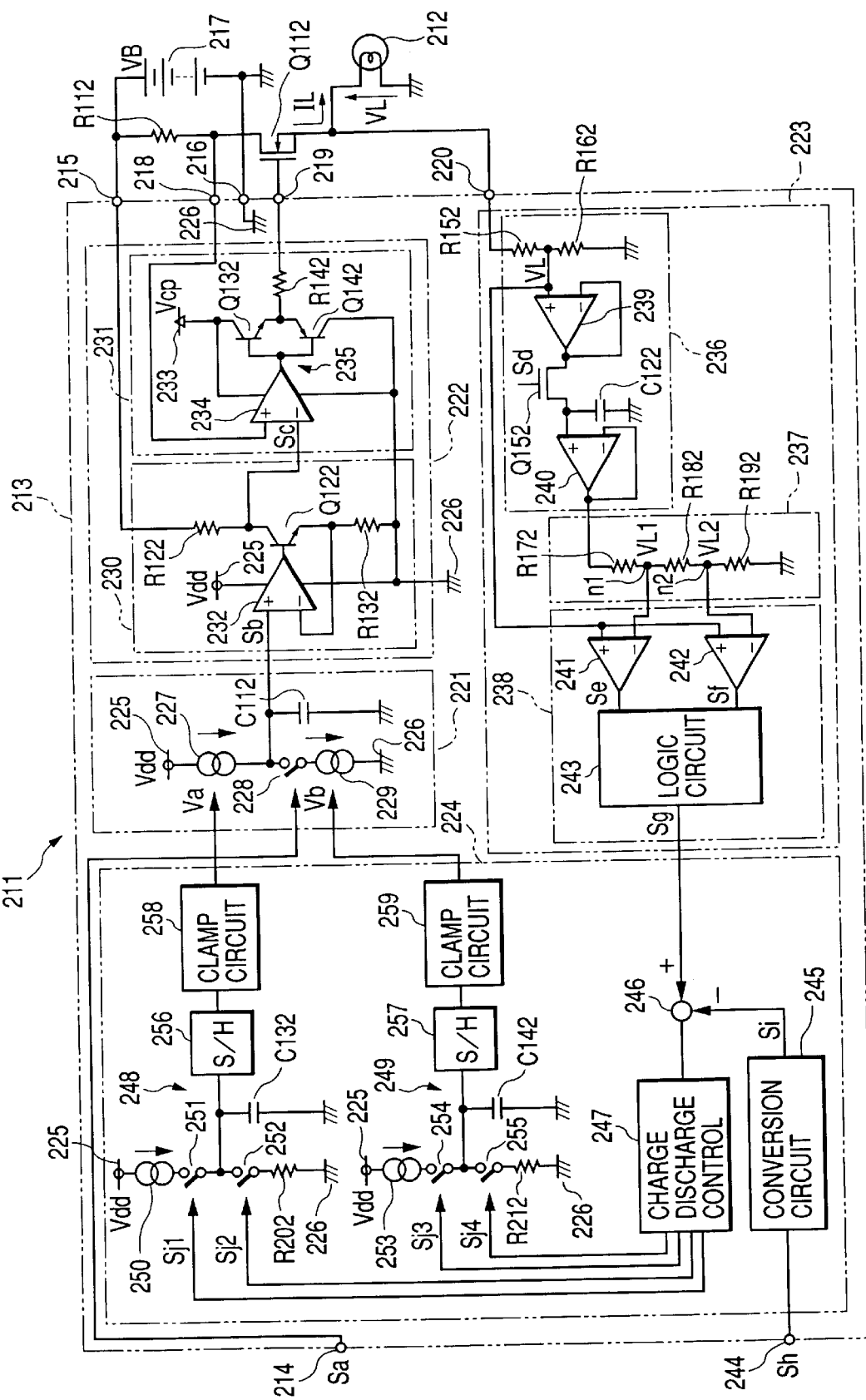
FIG. 15 is a circuit diagram showing the arrangement of an electric load drive apparatus in accordance with a third embodiment of the present invention.

FIG. 15 shows the circuit arrangement of an electric load drive circuit serving as the drive apparatus for an electric load.

An electric load drive circuit 211 receives a drive command signal Sa entered from an outside device, and controls (i.e., turns on and off or adjusts the brightness of) various lamps of an automotive vehicle, such as headlights, instrument panel indicators, and a passenger compartment lamp, in response to the received drive command signal Sa.

The electric load drive circuit 211 consists of an integrated circuit (IC) 213, resistor R112 (serving as current detecting section), and N-channel power MOS transistor Q112 (serving as switching element). IC 213 has an input terminal 214 for inputting the drive command signal Sa and power source terminals 215 and 216 connected to positive and negative terminals of battery 217 (serving as direct-current power source) respectively.

The resistor R112 is connected between the power source terminal 215 and a detecting terminal 218 to detect a current value (i.e., load current IL) flowing across the electric load 212. The power MOS transistor Q112 has drain, gate and source connected to detecting terminal 218, output terminal 219, and detecting terminal 220, respectively. The power MOS transistor Q112 functions as a high side switch. The electric load 212 is connected between the source of power MOS transistor Q112 and the negative terminal of battery 217.

IC 213 consists of a trapezoidal wave generating circuit 221 (serving as signal generating section), a current control circuit 222 (serving as load current control section), a rise/fall time measuring circuit 223 (serving as measuring section), and a gradient control circuit 224 (serving as gradient control section). The current control circuit 222, resistor R112 and power MOS transistor Q112 cooperatively function as current drive section of the present invention. Although not shown in the drawing, IC 213 comprises a power source circuit for converting the battery voltage VB into a power source voltage Vdd used for control and a charge pump circuit for producing a boost voltage Vcp which is higher than the battery voltage VB by at least a threshold voltage Vt of MOS transistor Q112.

The trapezoidal wave generating circuit 221 generates a trapezoidal wave signal Sb (corresponding to a current command signal) in accordance with the drive command signal Sa. A constant-current circuit 227 (serving as first current output circuit), a switch circuit 228, and a constant-current circuit 229 (serving as second current output circuit) are connected in series between a power source line 225 supplying the power source voltage Vdd and a ground line 226 connected to the power source terminal 216. A capacitor C112 is connected between the ground line 226 and a joint point of constant-current circuit 227 and switch circuit 228. The constant-current circuit 227 changes its output current value in accordance with a control voltage Va supplied from the gradient control circuit 224. Similarly, the constant-current circuit 229 changes its output current value in accordance with a control voltage Vb supplied from the gradient control circuit 224. The switch circuit 228 is constituted by a transistor which turns off in response to the drive command signal Sa of H level (i.e., drive command) and turns on in response to the drive command signal Sa of L level (i.e., stop command).

The current control circuit 222 consists of a voltage conversion circuit 230 and an error amplification circuit 231. The voltage conversion circuit 230 converts the trapezoidal wave signal Sb into a trapezoidal wave signal Sc by inverting the trapezoidal wave signal Sb. The trapezoidal wave signal Sb has an electric potential defined with respect to the reference voltage of ground line 226, while the trapezoidal wave signal Sc has an electric potential defined with respect to the reference voltage of power source terminal 215. An operational amplifier 232 operates when it receives the power source voltage Vdd from power source line 225. The operational amplifier 232 has a non-inverting input terminal connected to an output terminal of the above-described trapezoidal wave generating circuit 221. The operational amplifier 232 has an output terminal connected to a base of NPN transistor Q122. The operational amplifier 232 has an inverting terminal connected to an emitter of NPN transistor Q122. The transistor Q122 has a collector connected to the power source terminal 215 via a resistor R122. The transistor Q122 has an emitter connected to the ground line 226 via a resistor R132.

The error amplification circuit 231 compares the inverted trapezoidal wave signal Sc with the voltage applied to the resistor R112. Then, the error amplification circuit 231 controls the gate potential of MOS transistor Q112 so as to equalize the applied voltage of resistor R112 with the inverted trapezoidal wave signal Sc. The error amplification circuit 231 consists of an operational amplifier 234 and a push-pull circuit 235. The operational amplifier 234 operates in response to a booster voltage Vcp supplied from a charge pump circuit (not shown) via a power source line 233. The push-pull circuit 235 is connected between the power source line 233 and the ground line 226. The push-pull circuit 235 consists of a NPN transistor Q132 and a PNP transistor Q142.

The operational amplifier 234 has a non-inverting input terminal connected to the detecting terminal 218. The operational amplifier 234 has an inverting input terminal connected to a joint point of the resistor R122 and the collector of transistor Q122. The operational amplifier 234 has an output terminal connected to a common base of the transistors Q132 and Q142. The transistors Q132 and Q142 have a common emitter connected to the output terminal 219 via a resistor R142.

When the offset voltage of operational amplifier 234 appears at the positive side, there is the possibility that a very small load current IL flows even if the trapezoidal wave signal Sb is 0V. Hence, according to this embodiment, in a differential amplification circuit (not shown) constituting an input stage of operational amplifier 234, the size of a load transistor corresponding to each input terminal is set to a unique value. Hence, the offset voltage of operational amplifier 234 surely appears at the negative side.

The measuring circuit 223 consists of a sample-hold circuit 236 (serving as voltage detecting section), a voltage dividing circuit 237 (serving as reference voltage generating section), and a time measuring circuit 238 (serving as time measuring section).

The sample-hold circuit 236 divides a voltage of detecting terminal 220 (i.e., a load voltage VL applied between electric load 212) and holds a divided voltage VL' in synchronism with a control signal Sd. Resistors R152 and R162 are serially connected between the detecting terminal 220 and the ground line 226. A noint point of resistors R152 and R162, serving as voltage dividing point, is connected to a non-inverting input terminal of operational amplifier 239 of a voltage follower type. The operational amplifier 239 has an output terminal connected to a non-inverting input terminal of operational amplifier 240 of a voltage follower type via a drain-source path of N-channel MOS transistor Q152. A holding capacitor C122 is connected between the non-inverting input terminal of operational amplifier 240 and the ground line 226.

The voltage dividing circuit 237 consists of three resistors R172, R182, and R192 connected in series between the output terminal of operational amplifier 240 and the ground line 226. The resistance ratio of resistors R172, R182, and R192 is 1:8:1. Thus, a dividing node n1 of voltage dividing circuit 237 provides a first reference voltage VL1 (=0.9× sample-holding output VL') and another dividing node n2 of voltage dividing circuit 237 provides a second reference voltage VL2 (=0.1×sample-holding output VL').

The time measuring circuit 238 consists of a comparator 241 comparing the voltage VL' with the first reference voltage VL1, a comparator 242 comparing the voltage VL' with the second reference voltage VL2, and a logic circuit 243. The logic circuit 243 produces a H-level signal when a comparison signal Se of comparator 241 is L level and a comparison signal Sf comparator 242 is H level. In other words, an output Sg of logic circuit 243 is H level when the voltage VL' is in the range from first reference voltage VL1 and second reference voltage VL2. The output Sg of logic circuit 243 is L level when the voltage VL' is higher than first reference voltage VL1 or lower than second reference voltage VL2 (refer to FIG. 16(h)).

A rise time of trapezoidal wave voltage VL' is defined as duration from a time the voltage starts increasing from 0V to a time the voltage reaches an upper edge and stops increasing. A fall time of trapezoidal wave voltage VL' is defined as duration from a time the voltage starts decreasing from the upper edge and a time the voltage reaches 0V and stops decreasing. The same explanation is applied to the waveform of load voltage VL applied to electric load 212 as well as to the waveform of load current IL. According to this definition, the H-level term of (i.e., pulse width) of pulse signal Sg produced from the time measuring circuit 238 becomes 0.8 times the rise or fall time.

The gradient control circuit 224 controls the constant-current circuits 227 and 229 so as to equalize the rise time and the fall time measured by measuring circuit 223 with reference rise time Ta and reference fall time Tb given as clock signal Sh from terminal 244 of IC 213. According to this embodiment, each of reference rise time Ta and reference fall time Tb is equal to 200 μsec. When the reference rise time Ta and the reference fall time Tb are adequately determined, noise generation during the current supply/stop operation and drain loss of MOS transistor Q112 can be suppressed satisfactorily.

A conversion circuit 245 counts the clock signal Sh and outputs a reference pulse signal Si. The reference pulse signal Si is a cyclic signal which turns into H level in response to rise of pulse signal Sa for a duration (160 μsec) equivalent to 0.8 times the reference rise time Ta or the reference fall time Tb. A subtraction circuit 246 subtracts the pulse width of reference pulse signal Si from the pulse width of pulse signal Sg. A charge/discharge control circuit 247 outputs drive signals Sj1 and Sj2 to a charge/discharge circuit 248, and also outputs drive signals Sj3 and Sj4 to another charge/discharge circuit 249.

The charge/discharge circuit 248 comprises a constant-current circuit 250, switch circuits 251 and 252, and a resistor R202 serially connected between power source line 225 and ground line 226. The charge/discharge circuit 248 further comprises a capacitor C132 connected between ground line 226 and a joint point between switch circuits 251 and 252. Similarly, the charge/discharge circuit 249 comprises a constant-current circuit 253, switch circuits 254 and 255, and a resistor R212 serially connected between power source line 225 and ground line 226. The charge/discharge circuit 249 further comprises a capacitor C142 connected between ground line 226 and a joint point between switch circuits 254 and 255. The switch circuit 251 is closed when the drive signal Sj1 is H level. The switch circuit 252 is closed when the drive signal Sj2 is H level. The switch circuit 254 is closed when the drive signal Sj3 is H level. The switch circuit 254 is closed when the drive signal Sj4 is H level.

A sample-hold circuit 256 holds the control voltage Va produced from charge/discharge circuit 248 in synchronism with the drive command signal Sa. The control voltage Va is supplied via a clamp circuit 258 to constant-current circuit 227 of trapezoidal wave generating circuit 221. The clamp circuit 258, serving as gradient limit section, prevents the control voltage Va from exceeding a predetermined regulation voltage. Another sample-hold circuit 257 holds the control voltage Vb produced from charge/discharge circuit 249 in synchronism with the drive command signal Sa. The control voltage Vb is supplied via a clamp circuit 259 to constant-current circuit 229 of trapezoidal wave generating circuit 221. The clamp circuit 259, serving as gradient limit section, prevents the control voltage Vb from exceeding a predetermined regulation voltage.

The subtraction circuit 246, the charge/discharge control circuit 247, and the charge/discharge circuit 248 cooperatively constitute a first current control section of the present invention. The subtraction circuit 246, the charge/discharge control circuit 247, and the charge/discharge circuit 249 cooperatively constitute a second current control section of the present invention.

Next, operation of the electric load drive circuit 211 will be explained with reference to FIGS. 16 and 17.

Figure 16:
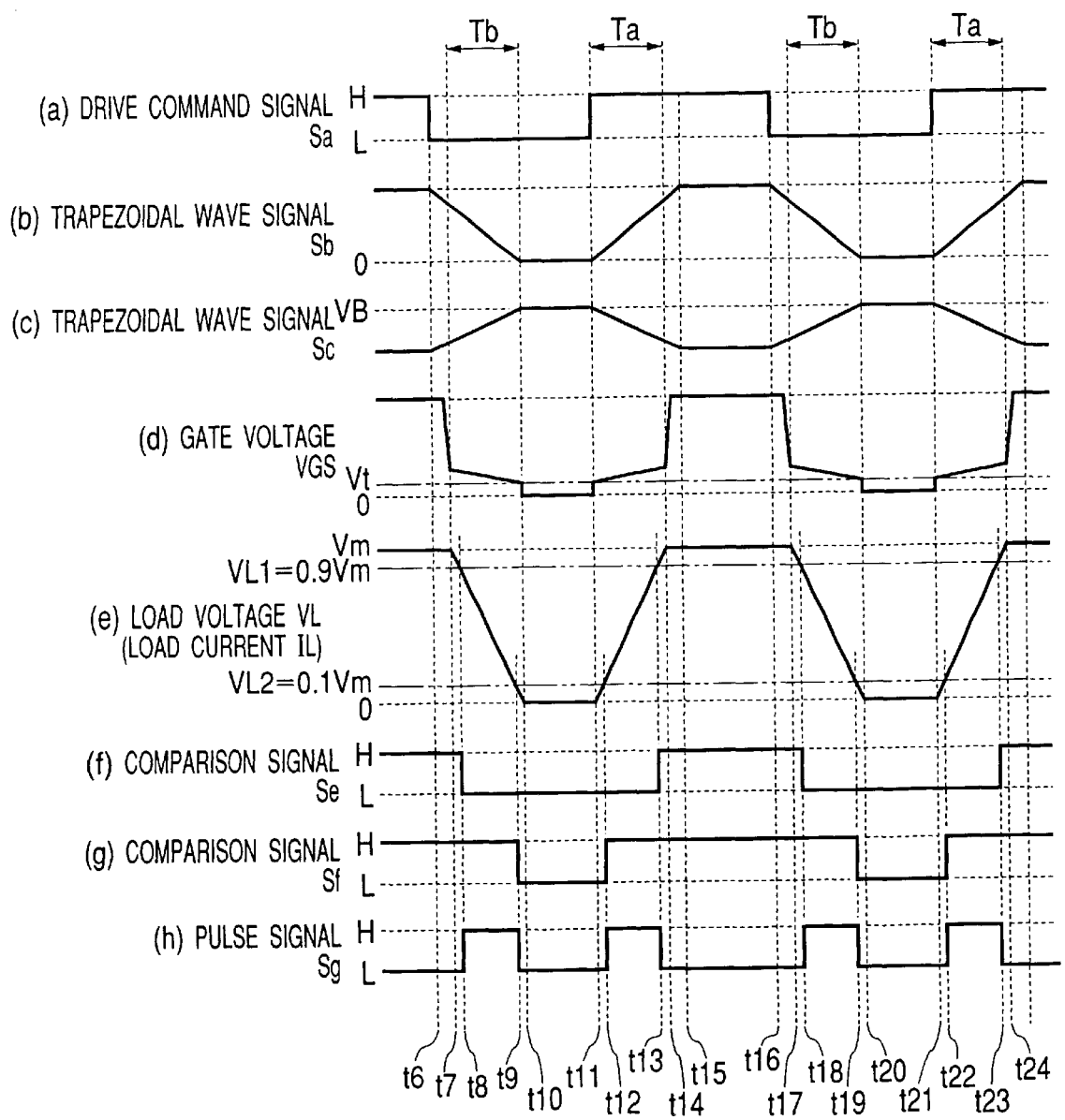
FIG. 16 is a time chart showing the waveforms of various portions in the electric load drive apparatus shown in FIG. 15 observed when a PWM signal is entered as a drive command signal Sa.

FIG. 16 shows the waveforms of various portions in the electric load drive circuit 211 in the case the electric load 212 is a lamp and a PWM signal having a predetermined duty ratio and a predetermined frequency (e.g., 100 Hz) is entered as drive command signal Sa for controlling the brightness of lamp.

The waveforms shown in FIG. 16 are (a) drive command signal Sa, (b) trapezoidal wave signal Sb, (c) trapezoidal wave signal Sc, (d) gate voltage VGS of MOS transistor Q112, (e) load voltage VL applied to electric load 212 (load current IL), (f) comparison signal Se, (g) comparison signal Sf, and (h) pulse signal Sg.

First, the fundamental operation of electric load drive circuit 211 will be explained with reference to FIG. 16. When the drive command signal Sa turns into H level from L level (at time t11), the switch circuit 228 of trapezoidal wave generating circuit 221 opens. The current of constant-current circuit 227 flows into capacitor C112. Thus, the trapezoidal wave signal Sb, i.e., voltage applied to capacitor C112, increases from 0V (corresponding to first level) at a constant gradient.

The current control circuit 222 controls the gate potential (i.e., gate voltage VGS) of MOS transistor Q112 so as to equalize the voltage applied to resistor R112 with the trapezoidal wave signal Sc. The trapezoidal wave signal Sc has an inverse shape of the trapezoidal wave signal Sb. The load current IL increases in accordance with the trapezoidal wave signal Sb. The load current IL starts flowing at the time the gate voltage VGS has reached the threshold voltage Vt of MOS transistor Q112. Therefore, the load current flowing start time is somewhat delayed with respect to time t11.

The load current IL increases in accordance with the trapezoidal wave signal Sb and then enters into the current saturation state at time t14. Thus, the load current IL stops increasing irrespective of continuous increase of trapezoidal wave signal Sb. The current saturation state is referred to as state where the MOS transistor Q112 operates in the linear region and almost all of battery voltage VB is applied to electric load 212. When RL represents a resistance value of electric load 212, the saturation load current ILm is expressed by VB/RL.

After the time t14, the voltage applied to resistor R112 deviates from the trapezoidal wave signal Sc. Thus, the output voltage of operational amplifier 234, i.e., the gate potential of MOS transistor Q112, abruptly increases up to boost voltage Vcp. The trapezoidal wave signal Sb reaches its upper edge voltage (corresponding to second level) at time t15 and stops increasing.

Subsequently, the trapezoidal wave signal Sc turns into L level from H level at time t16. In the trapezoidal wave generating circuit 221, the switch circuit 228 closes. The trapezoidal wave signal Sb, i.e., voltage applied to capacitor C112, decreases at a constant gradient. The current flowing into capacitor C112 is equal to a difference between an output current of constant-current circuit 229 and an output current of constant-current circuit 227. The gate voltage VGS becomes equal with the threshold voltage Vt at time t17. After time t17, the load current IL continuously decreases in accordance with the trapezoidal wave signal Sb. At time t20, the gate voltage VGS cannot maintain the level of threshold Vt. The load current IL becomes 0 at time t20.

In this manner, the load current IL changes in accordance with trapezoidal wave signal Sb during the current non-saturation term. However, the load current IL is limited to the saturation load current ILm during the current saturation term (i.e., term t14–t17). Accordingly, if the gradient of trapezoidal wave signal Sb is limited to a constant value, the rise time and the fall time of load current IL will vary in accordance with the impedance (i.e., resistance value) of electric load 212.

However, according to this embodiment, the rise time and the fall time of load current IL are equalized with the reference rise time Ta and the reference fall time Tb, respectively, irrespective of impedance (i.e., resistance value) of electric load 212. This control will be explained in more detail.

The control signal Sd temporarily turns into H level at each moment (t6, t16, - - -) the drive command signal Sa turns into L level from H level. In response to every change to H level of control signal Sd, the sample-hold circuit 236 causes the capacitor C122 to hold the voltage VL' which is produced by dividing the load voltage VL applied to the electric load 212. The voltage held in capacitor C122 is a voltage Vm' obtained by dividing the upper-edge voltage Vm of the load voltage VL applied to the electric load 212.

In this manner, the measuring circuit 223 detects the load voltage VL applied to electric load 212. The load voltage VL is proportional to the load current IL. Hence, the measuring circuit 223 substantially detects the load current IL. In this respect, the load voltage VL is a current detecting signal of the present invention. In the following explanation, to simplify the explanation, it is assumed that the resistor R152 is 0. Accordingly, the voltage VL' is equal to load voltage VL and the voltage Vm' is equal to the upper edge voltage Vm.

The comparator 241 compares the load voltage VL with the first reference voltage VL1 (=0.9×Vm). The comparator 242 compares the load voltage VL with the second reference voltage VL2 (=0.1×Vm). The upper edge voltage Vm held at time t6 is used in the measurement of succeeding rise time (i.e., term t7–t10) as well as in the measurement of succeeding fall time (i.e., term t11–t14). The upper edge voltage Vm held at time t16 is used in the measurement of succeeding rise time (i.e., term t17–t20) as well as in the measurement of succeeding fall time (i.e., term t21–t24).

The pulse signal Sg generated from logic circuit 243 becomes H level during the rise term and the fall term of load voltage VL. The pulse width of pulse signal Sg is equal to 0.8 times the rise or fall time of load voltage VL. On the other hand, the reference pulse signal Si becomes H level during the rise term and the fall term of load voltage VL. The pulse width of reference pulse signal Si is equal to 0.8 times the reference rise time Ta or the reference fall time Tb.

The charge/discharge control circuit 247 compares the pulse width of pulse signal Sg with the pulse width of reference pulse signal Si in response to each rise and each fall of load voltage VL. The charge/discharge control circuit 247 controls the charge/discharge circuit 248 via the drive signals Sj1 and Sj2 during the rise term of load voltage VL. The charge/discharge control circuit 247 controls the charge/discharge circuit 249 via the drive signals Sj3 and Sj4 during the fall term of load voltage VL. During the rise term and the fall term, the charge/discharge control circuit 247 is controlled in the following manner.

① In case of pulse width of pulse signal Sg>pulse width of reference pulse signal Si The drive signal Sj1 becomes H level for a duration corresponding to a difference between these pulse widths. In this case, constant-current circuit 250 charges the capacitor C132. The control voltage Va increases. In response to the increase of control voltage Va, the output current of constant-current circuit 227 in the trapezoidal wave generating circuit 221 increases. Hence, the trapezoidal wave signal Sb, the load current IL and the load voltage VL rise at increased rates, respectively. The rise time becomes short so as to be equalized with the reference rise time Ta.

② In case of pulse width of pulse signal Sg<pulse width of reference pulse signal Si The drive signal Sj2 becomes H level for a duration corresponding to a difference between these pulse widths. In this case, capacitor C132 discharges through resistor R202. The control voltage Va decreases. In response to the decrease of control voltage Va, the output current of constant-current circuit 227 decreases. Hence, the trapezoidal wave signal Sb, the load current IL and the load voltage VL rise at decreased rates, respectively. The rise time becomes long so as to be equalized with the reference rise time Ta.

③ In case of pulse width of pulse signal Sg=pulse width of reference pulse signal Si Both of drive signals Sj1 and Sj2 become L level. In this case, the control voltage Va does not change and accordingly the output current value of constant-current circuit 227 is maintained at the present value. As a result, the rise time does not deviate from the reference rise time Ta.

Figure 17:
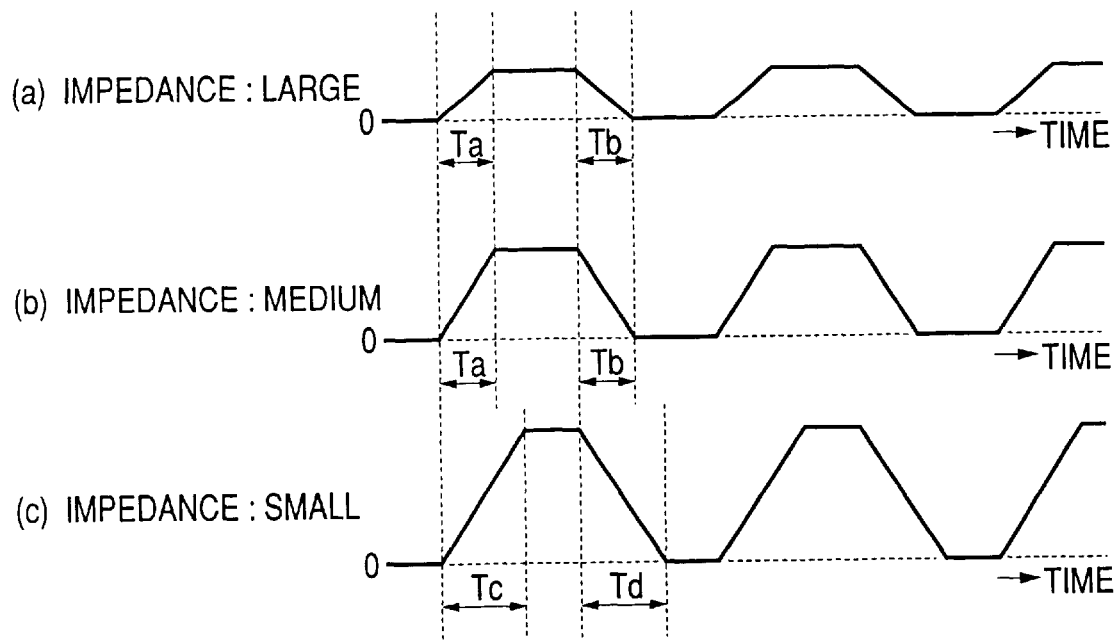
FIG. 17 is a time chart showing the waveforms of load current in various cases different in the impedance of an electric load.

FIG. 17 shows the waveforms of load current IL flowing across the electric load 212, in which the waveform of FIG. 17(a) corresponds to an electric load having the largest impedance and the waveform of FIG. 17(c) corresponds to an electric load having the smallest impedance. As shown in FIGS. 17(a) and 17(b), the rise time and the fall time of load current IL are controlled to be equal with the reference rise time Ta and the reference fall time Tb, respectively, irrespective of impedance of electric load 212.

However, in the case of FIG. 17(c), rise time Tc and fall time Td of load current IL are longer than the reference rise time Ta and the reference fall time Tb, respectively (i.e., Tc>Ta, Td>Tb). The reason is that the clamp circuits 258 and 259 provided in the gradient control circuit 224 prevent the output currents of constant-current circuits 227 and 229 from exceeding predetermined values. The change rate of load current IL is therefore limited within a regulated value. The regulated value for the change rate should be determined considering the allowable level of noise.

As explained above, the electric load drive circuit 211 detects the load current IL by the resistor R112 and supplies the trapezoidal current to the electric load 212 so as to equalize the load current IL with the trapezoidal wave signal Sc. Hence, the electric load drive circuit 211 can prevent the electric load 212 from changing abruptly at the current supply start time and at the current supply stop time. This is effective to reduce the noise caused by abrupt current change. In this case, as the load current IL is directly controlled, distortion of current can be suppressed to a small value and the noise can be surely reduced.

For example, when the electric load 212 is a lamp, the impedance (i.e., resistance value) of electric load 212 changes according to heat generation. Furthermore, there is the possibility that a user may install another type of lamp which has a different rated current (i.e., impedance).

Under such circumstances, the measuring circuit 223 measures the rise time and the fall time of load voltage VL applied to electric load 212 (which is proportional to the load current IL). The gradient control circuit 224 controls the increase and decrease rates of trapezoidal wave signal Sb so as to equalize the rise time and the fall time with the reference rise time Ta and the reference fall time Tb. According to this embodiment, the load current IL increases during reference rise time Ta and decreases during reference fall time Tb irrespective of impedance (i.e., resistance value) of electric load 212.

Namely, irrespective of electric load 212 to be driven, the rise and fall of load current IL are limited to minimum change rates in an allowable region considering the drain loss of MOS transistor Q112 or the like. Thus, it becomes possible to reduce the noise generated when the electric load 212 is activated or deactivated. As a result, it becomes possible to reduce the noise giving adverse influence to a car radio or to other control devices installed in an automotive vehicle. The radio noise reduces. Other control devices can operate stably. The life of a lamp becomes long.

Furthermore, the electric load 212 is PWM driven in accordance with the drive command signal Sa. The latest upper edge voltage Vm, held in sample-hold circuit 236 in response to every cycle of the PWM signal, is used to measure the rise time and fall time of load voltage VL. This is effective to reduce the measuring error. The control can be performed accurately.

Furthermore, the clamp circuits 258 and 259 prevent the change rate of trapezoidal wave signal Sb, i.e., change rate of load current IL, from exceeding a predetermined value. Therefore, it becomes possible to prevent the generated noise from exceeding an allowable level even when the connected electric load 212 has an extremely small impedance.

As apparent from the foregoing description, the third embodiment of the present invention provides an electric load drive apparatus comprising:

a signal generating section (221) for generating a current command signal (Sb) in accordance with a drive command signal (Sa) entered from an external device, the current command signal (Sb) having a trapezoidal waveform increasing from a first level to a second level in response to a drive start command and decreasing from the second level to the first level in response to a drive stop command;

a current drive section (222, R112, Q112), provided in a current supply path extending from a direct-current power source (VB) to an electric load (212), for detecting a load current (IL) flowing across the electric load (212) and outputting a trapezoidal current to the electric load (212) based on a comparison between the detected load current (IL) and the current command signal (Sb);

a measuring section (223) for measuring a rise time of the load current corresponding to increase of the current command signal (Sb) and a fall time of the load current corresponding to decrease of the current command signal (Sb); and a gradient control section (224) for controlling a change rate of the current command signal (Sb) produced from the signal generating section (221) in such a manner that the measured rise time is equalized with a predetermined reference rise time (Ta) and the measured fall time is equalized with a predetermined reference fall time (Tb).

The gradient control section (224) comprises a gradient limit section (258, 259) for preventing the change rate of the current command signal (Sb) from exceeding a predetermined regulation value.

The measuring section (223) comprises:

a voltage detecting section (236) for detecting a load voltage (VL) applied on the electric load (212) when the current command signal (Sb) is in the second level;

a reference voltage generating section (237) for generating a first reference voltage (VL1) and a second reference voltage (VL2) having mutually different ratios with respect to the detected load voltage (VL) of the voltage detecting section (236); and a time measuring section (238) for measuring a time required for the load voltage (VL) applied on the electric load (212) to vary from the first reference voltage (VL1) to the second reference voltage (VL2) or vice versa.

The signal generating section (221) comprises:

a capacitor (C112) for outputting the current command signal (Sb);

a first current output circuit (227), having a controllable output current, for supplying a charge current of the capacitor (C112); and a second current output circuit (229), having a controllable output current, for supplying a discharge current of the capacitor (C112).

The gradient control section (224) comprises:

a first current control section (246, 247, 248) for controlling the output current of the first current output circuit (227) based on a difference between the rise time measured by the measuring section (223) and the reference rise time (Ta); and a second current control section (246, 247, 249) for controlling the output current of the second current output circuit (229) based on a difference between the fall time measured by the measuring section (223) and the reference fall time (Tb).

Each of the first and second current output circuits (227, 229) produces a current in accordance with an entered control voltage, and each of the first and second current control section comprises a capacitor (C132; C142) for outputting the control voltage, a charge circuit (250, 251; 253, 254) for charging the capacitor when the difference is positive, and a discharge circuit (252, 255) for discharging the capacitor when the difference is negative.

The current drive section comprises a switching element (Q112) provided in a current supply path extending from the direct-current power source (217) to the electric load (212), a current detecting section (R12) for detecting the load current (IL) and producing a current detecting signal, and a load current control section (222) for controlling the switching element (Q112) based on a difference between the current detecting signal and the current command signal (Sb).

The drive command signal (Sa) is a cyclic pulse signal having a controlled duty ratio.

The above-described embodiment of the present invention is not limited to the disclosed one. For example, the embodiment of the present invention can be modified in the following manner.

The MOS transistor Q112, serving as switching element, can be interposed between the electric load 212 and the ground line. In this case, MOS transistor Q112 can function as a low side switch. It is preferable that resistor R112 is interposed between MOS transistor Q112 and the ground line. This is effective to simplify the circuit arrangement for detecting a voltage value representing the load current IL. Furthermore, it is possible to use a bipolar transistor or IGBT for switching element.

The measuring circuit 223 detects the load voltage VL applied to electric load 212 to indirectly measure the load current IL. However, it is preferable to use a voltage applied to the resistor R112. It is also possible to provide a special current detecting resistor other than the resistor R112. It is, of course, preferable to provide a current detecting section for directly detecting the load current IL.

The clamp circuits 258 and 259 are generally provided as occasion demands, for example, when the electric load 212 has a low impedance.

The capacitors C132 and C142 have function of holding the control voltages Va and Vb, respectively. Therefore, the sample-hold circuits 256 and 257 can be removed. The capacitors C112, C132, and C142 are installed in IC 213. However, it is possible to provide these capacitors outside IC 213.

Fourth Embodiment

A fourth embodiment of the present invention will be explained with reference to FIGS. 18 and 19.

Figure 18:
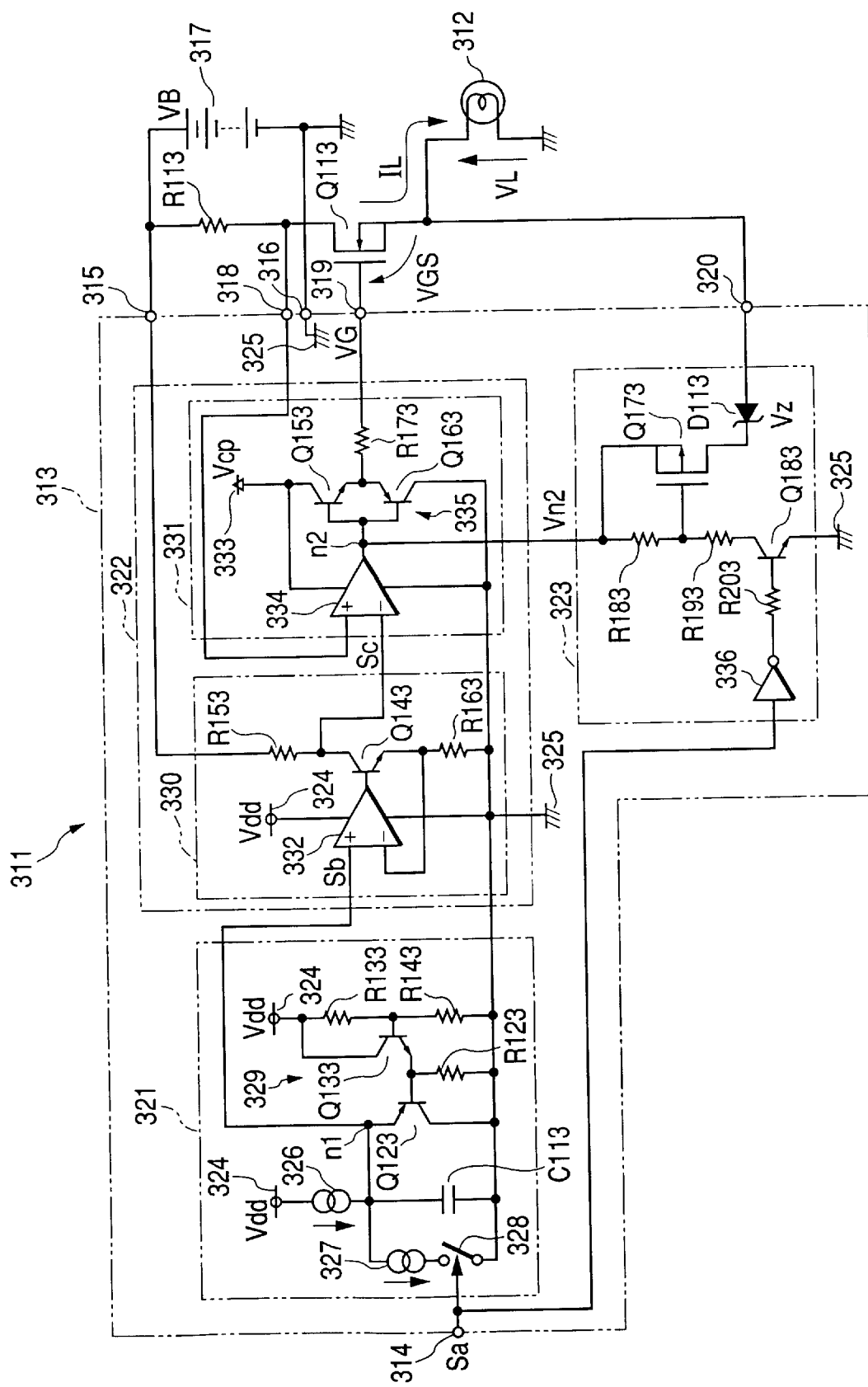
FIG. 18 a circuit diagram showing the arrangement of an electric load drive apparatus in accordance with a third embodiment of the present invention.

FIG. 18 shows the circuit arrangement of an electric load drive circuit serving as the drive apparatus for an electric load.

An electric load drive circuit 311 receives a drive command signal Sa entered from an outside device, and controls (i.e., turns on and off or adjusts the brightness of) various lamps of an automotive vehicle, such as headlights, instrument panel indicators, and a passenger compartment lamp, in response to the received drive command signal Sa.

The electric load drive circuit 311 consists of an integrated circuit (IC) 313, resistor R113 (serving as current detecting section), and N-channel power MOS transistor Q113. IC 313 has an input terminal 314 for inputting the drive command signal Sa and power source terminals 315 and 316 connected to positive and negative terminals of battery 317 (serving as direct-current power source) respectively.

The resistor R113 is connected between the power source terminal 315 and a detecting terminal 318 to detect a current value (i.e., load current IL) flowing across the electric load 312. The power MOS transistor Q113 has drain, gate and source connected to detecting terminal 318, output terminal 319, and load terminal 320, respectively. The power MOS transistor Q113 functions as a high side switch. The electric load 312 is connected between the source (i.e., load terminal 320) of power MOS transistor Q113 and the negative terminal of battery 317.

IC 313 consists of a trapezoidal wave generating circuit 321 (serving as signal generating section), a current control circuit 322 (serving as current control section), and a clamp circuit 323 (serving as control voltage limit section). Although not shown in the drawing, IC 313 comprises a power source circuit for converting the battery voltage VB into a power source voltage Vdd used for control and a charge pump circuit for producing a boost voltage Vcp which is higher than the battery voltage VB by at least a threshold voltage Vt of MOS transistor Q113. According to this embodiment, the battery voltage VB is 14V, the boost voltage Vcp is 24V, and the threshold voltage Vt is 2V.

The trapezoidal wave generating circuit 321 generates a trapezoidal wave signal Sb (corresponding to a current command signal) in accordance with the drive command signal Sa. A constant-current circuit 326 and a capacitor C113 are connected in series between a power source line 324 supplying the power source voltage Vdd and a ground line 325 connected to the power source terminal 316. A constant-current circuit 327 and a switch circuit 328 are connected in series between both positive and negative terminals of capacitor C113. The constant-current circuit 327 produces a current Ib (<Ia). The switch circuit 328 is constituted by a transistor which turns off in response to the drive command signal Sa of H level (i.e., drive command) and turns on in response to the drive command signal Sa of L level (i.e., stop command). The positive terminal of capacitor C113 serves as output node n1 of trapezoidal wave generating circuit 321. The trapezoidal wave signal Sb having a trapezoidal waveform voltage is produced from the output node n1 of trapezoidal wave generating circuit 321.

The trapezoidal wave generating circuit 321 comprises a voltage restricting circuit 329 which limits the voltage produced from output node n1 to prevent the load current IL from excessively increasing. More specifically, an emitter and a collector of PNP transistor Q123 are connected to positive and negative terminals of capacitor C113. A base of PNP transistor Q123 is connected to the ground line 325 via a resistor R123 and is also connected to an emitter of NPN transistor Q133. A collector of transistor Q133 is connected to the power source line 324. A base of transistor Q133 is connected to a joint point (i.e., voltage dividing point) of registers R133 and R143 connected in series between the power source line 324 and the ground line 325.

The current control circuit 322 consists of a voltage conversion circuit 330 and an error amplification circuit 331. The voltage conversion circuit 330 converts the trapezoidal wave signal Sb into a trapezoidal wave signal Sc by inverting the trapezoidal wave signal Sb. The trapezoidal wave signal Sb has an electric potential defined with respect to the reference voltage of ground line 325, while the trapezoidal wave signal Sc has an electric potential defined with respect to the reference voltage of power source terminal 315. An operational amplifier 332 operates when it receives the power source voltage Vdd from power source line 324. The operational amplifier 332 has a non-inverting input terminal connected to the output node n1 of the above-described trapezoidal wave generating circuit 321. The operational amplifier 332 has an output terminal connected to a base of NPN transistor Q143. The operational amplifier 332 has an inverting terminal connected to an emitter of NPN transistor Q143. The transistor Q143 has a collector connected to the power source terminal 315 via a resistor R153. The transistor Q143 has an emitter connected to the ground line 325 via a resistor R163.

The error amplification circuit 331 compares the inverted trapezoidal wave signal Sc with the voltage applied to the resistor R113. Then, the error amplification circuit 331 controls the gate potential VG of MOS transistor Q113 so as to equalize the applied voltage of resistor R113 with the inverted trapezoidal wave signal Sc. The error amplification circuit 331 consists of an operational amplifier 334 (serving as error amplifying section) and a push-pull circuit 335. The operational amplifier 334 operates in response to a booster voltage Vcp supplied from a charge pump circuit (not shown) via a power source line 333. The push-pull circuit 335 is connected between the power source line 333 and the ground line 325. The push-pull circuit 335 consists of a NPN transistor Q153 and a PNP transistor Q163.

The operational amplifier 334 has a non-inverting input terminal connected to the detecting terminal 318. The operational amplifier 334 has an inverting input terminal connected to a joint point of the resistor R153 and the collector of transistor Q143. The operational amplifier 334 has an output terminal (node n2) connected to a common base of the transistors Q153 and Q163. The transistors Q153 and Q153 have a common emitter connected to the output terminal 319 via a resistor R173.

When the offset voltage of operational amplifier 334 appears at the positive side, there is the possibility that a very small load current IL flows even if the trapezoidal wave signal Sb is 0V. Hence, according to this embodiment, in a differential amplification circuit (not shown) constituting an input stage of operational amplifier 334, the size of a load transistor corresponding to each input terminal is set to a unique value. Hence, the offset voltage of operational amplifier 334 surely appears at the negative side.

The clamp circuit 323 prevents the potential of node n2 from exceeding a predetermined value (i.e., later-described decreasing start level) with respect to the potential of load terminal 320 when the drive command signal Sa is L level (i.e., stop command). A source-drain connection of P-channel MOS transistor Q173 (serving as switch circuit) and a Zener diode D113 (serving as voltage limit circuit) having the polarity shown in the drawing are serially connected between the node n2 and the load terminal 320. Resistor R183 is connected between source and gate terminals of MOS transistor Q173. The gate of MOS transistor Q173 is connected to the ground line 325 via a resistor R193 and a collector-emitter connection of NPN transistor Q183. The drive command signal Sa is inverted via inverter 336 and resistor R203 and entered into a base of transistor Q183.

Next, operation of electric load drive circuit 311 will be explained with reference to the time chart shown in FIG. 19.

Figure 19:
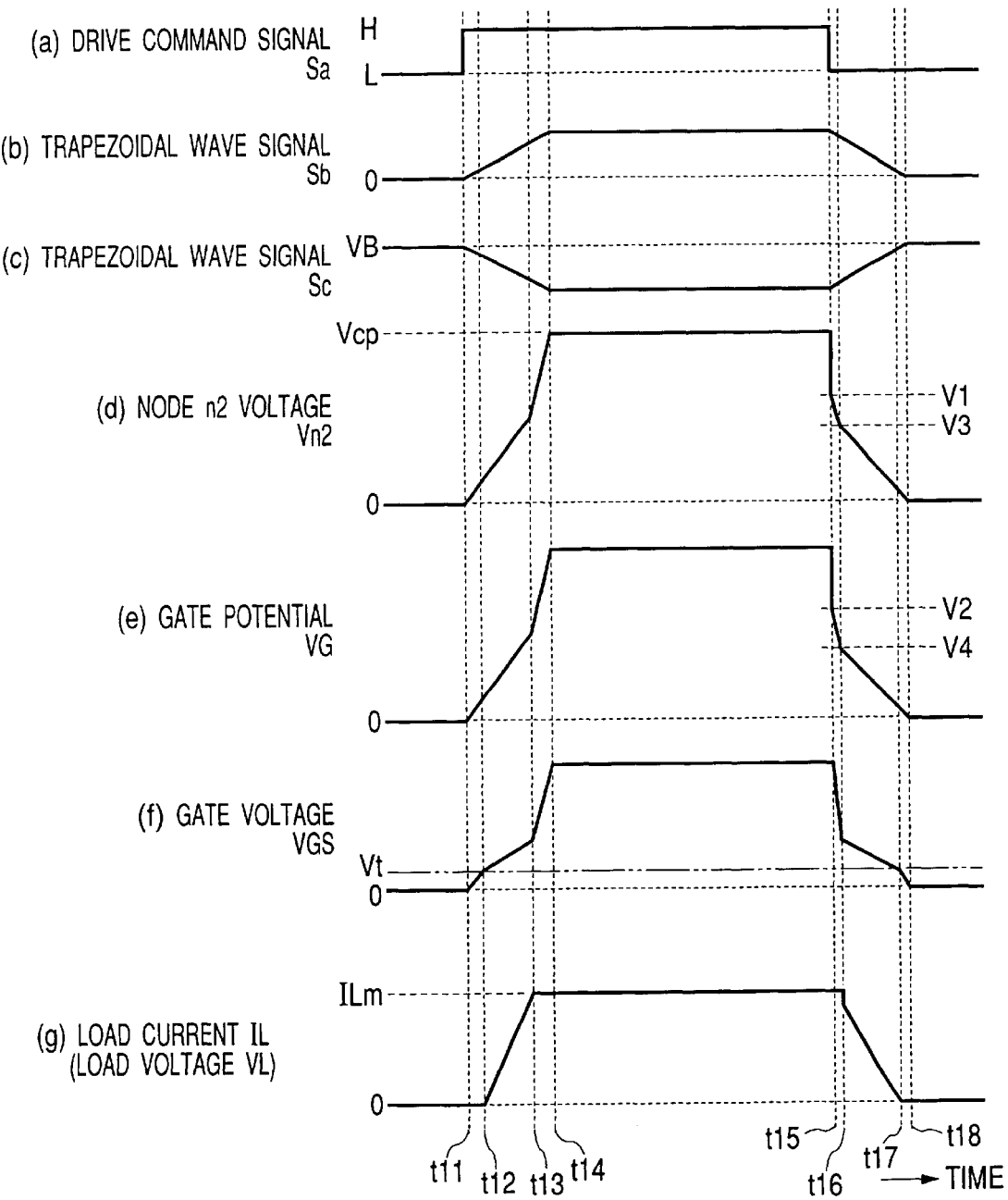
FIG. 19 is a time chart showing the waveforms of various portions in the electric load drive apparatus shown in FIG. 18 observed when a PWM signal is entered as a drive command signal Sa.

FIG. 19 shows the waveforms of various portions in the electric load drive circuit 311 in the case the electric load 312 is a lamp and a PWM signal having a predetermined duty ratio and a predetermined frequency (e.g., 100 Hz) is entered as drive command signal Sa for controlling the brightness of lamp.

The waveforms shown in FIG. 19 are (a) drive command signal Sa, (b) trapezoidal wave signal Sb, (c) trapezoidal wave signal Sc, (d) node 'n2' voltage Vn2, (e) gate potential VG, (f) gate voltage VGS, and (g) load current IL (load voltage VL). In FIG. 19, the gate potential VG is an electric potential of the gate of MOS transistor Q113. The gate voltage VGS is a gate-source voltage of MOS transistor Q113. The gate voltage VGS is obtained by subtracting the potential VL of load terminal 320 from the gate potential VG (i.e., VGS=VG−VL).

When the drive command signal Sa turns into H level from L level (at time t11), the switch circuit 328 of trapezoidal wave generating circuit 221 opens. The current Ia of constant-current circuit 326 flows into capacitor C113. Thus, the trapezoidal wave signal Sb, i.e., voltage applied to capacitor C113, increases from 0V (corresponding to first level) at a constant gradient.

The current control circuit 222 controls the gate potential VG of MOS transistor Q113 so as to equalize the voltage applied to resistor R113 with the trapezoidal wave signal Sc. The trapezoidal wave signal Sc has an inverse shape of the trapezoidal wave signal Sb. The load current IL starts flowing at the time (t12) the gate voltage VGS has reached the threshold voltage Vt of MOS transistor Q113. The load current IL increases at a constant rate in accordance with the trapezoidal wave signal Sb.

Then, the load current IL enters into the current saturation state at time t13. The load current IL stops increasing irrespective of continuous increase of trapezoidal wave signal Sb. The current saturation state is referred to as state where the MOS transistor Q113 operates in the linear region and almost all of battery voltage VB is applied to electric load 312. When RL represents a resistance value of electric load 312, the saturation load current ILm is expressed by VB/RL.

When the electric load 312 is a lamp, there is the possibility that a lamp having a different rated current may be erroneously installed. The impedance of lamp may change due to heat generation. Considering these circumstances, the upper edge voltage of trapezoidal wave signal Sb is determined so that the load current reaches the current saturation state even when the electric load 312 has the lowest impedance.

After the time t13, the voltage applied to resistor R113 deviates from the trapezoidal wave signal Sb. Thus, the output voltage Vn2 of operational amplifier 334 and the gate potential VG of MOS transistor Q113 abruptly increase and reach the boost voltage Vcp at time t14. After time t14, the output voltage Vn2 of operational amplifier 334 and the gate potential VG of MOS transistor Q113 stop increasing. The trapezoidal wave signal Sb reaches the upper edge voltage (corresponding to second level) at time t14 and stops increasing. The upper edge voltage of trapezoidal wave signal Sb is lower than the power source voltage Vdd by an operation voltage of constant-current circuit 326. According to this embodiment, the increase stop timing (t14) of output voltage Vn2 and gate potential VG is equal to the upper-edge reaching timing (t14) of trapezoidal wave signal Sb. Even if the trapezoidal wave signal Sb is delayed from time t14, the output voltage Vn2 and the gate potential VG have the same waveform.

When the drive command signal Sa is H level (i.e., during a term t11–t15), the transistor Q183 of the clamp circuit 323 turns off. The transistor Q173 also turns off. Accordingly, the clamp circuit 323 is in a deactivated condition where no current is consumed. This is effective to reduce the consumption of electric power, for example, compared with a clamp circuit comprising only a Zener diode.

At time t15, the drive command signal Sa turns into L level from H level. The switch circuit 328 in trapezoidal wave generating circuit 321 turns on. The trapezoidal wave signal Sb, i.e., voltage applied to capacitor C113, decreases at a constant gradient according to a difference current between the output current Ib of constant-current circuit 327 and the output current Ia of constant-current circuit 326. Furthermore, the transistor Q183 of clamp circuit 323 turns on and accordingly a current flows from node n2 via resistors R183, R193 and transistor Q183. The resistor R183 causes a voltage drop corresponding to this current. MOS transistor Q173 turns on. In this case, the voltage VL of load terminal 320 is substantially equal to the battery voltage VB (14V). The output voltage Vn2 of operational amplifier 334 is substantially equal to the boost voltage Vcp (24V). Therefore, voltage (Vcp–VB) (=10V) is applied to both terminals of clamp circuit 323.

Zener diode D113 has a Zener voltage Vz (corresponding to decreasing start level) which is slightly higher than a threshold voltage Vt of MOS transistor Q113. According to this embodiment, the Zener voltage Vz is set to 5V. The threshold voltage Vt is the gate voltage VGS required for the MOS transistor Q113 to reduce the load current IL from saturation load current ILm. When transistor Q183 turns on, a current flows across MOS transistor Q173 and Zener diode D113. The voltage Vn2 of node n2 immediately reduces down to voltage V1 expressed by the following equation.

$$V1 = VB + Vz \quad (1)$$

In this case, transistor Q153 turns off and transistor Q163 turns on. The electric charge stored in the gate capacitor of MOS transistor Q113 is drawn via transistor Q163. The gate potential VG reduces down to voltage V2 expressed by the following equation.

$$V2 = VB + Vz + VF \quad (2)$$

where VF represents a base-emitter voltage of transistor Q163.

After time t15, the voltage Vn2 and the gate potential VG decrease in accordance with reduction of trapezoidal wave signal Sb. At time t16, the voltage Vn2 becomes V3 expressed by the following equation (3) and the gate potential VG becomes V4 expressed by the following equation (4). After time t16, the load current IL starts decreasing from saturation load current ILm. In the beginning of fall stage, the load current IL causes a small stepwise change.

$$V3 = VB + Vt - VF \quad (3)$$

$$V4 = VB + Vt \quad (4)$$

Subsequently, the gate voltage VGS reaches the threshold Vt at time t17. At this timing, MOS transistor Q113 turns off and load current IL becomes 0.

Figure 5:
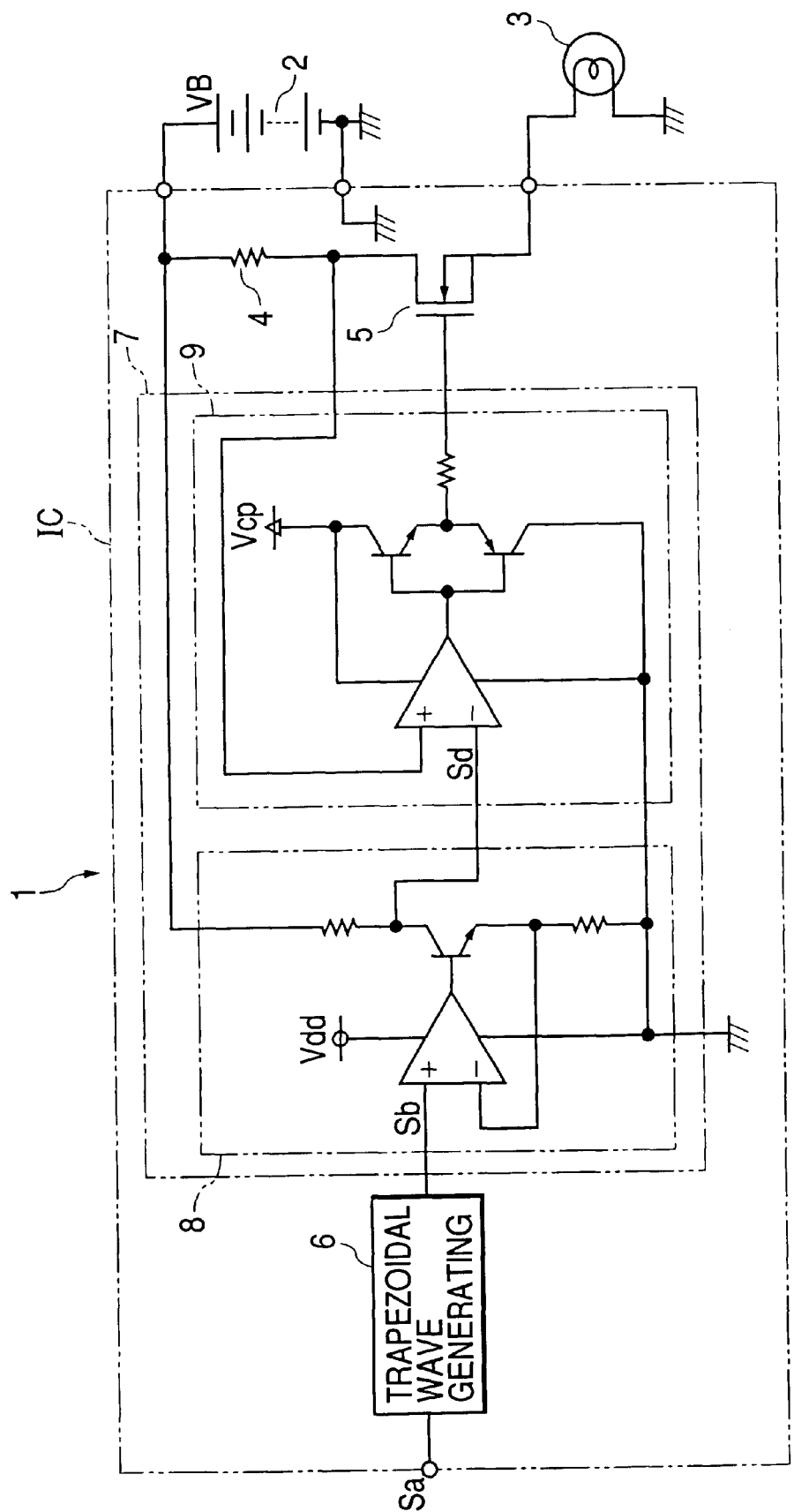
FIG. 5 is a circuit diagram showing the arrangement of a conventional electric load drive apparatus.
Figure 6:
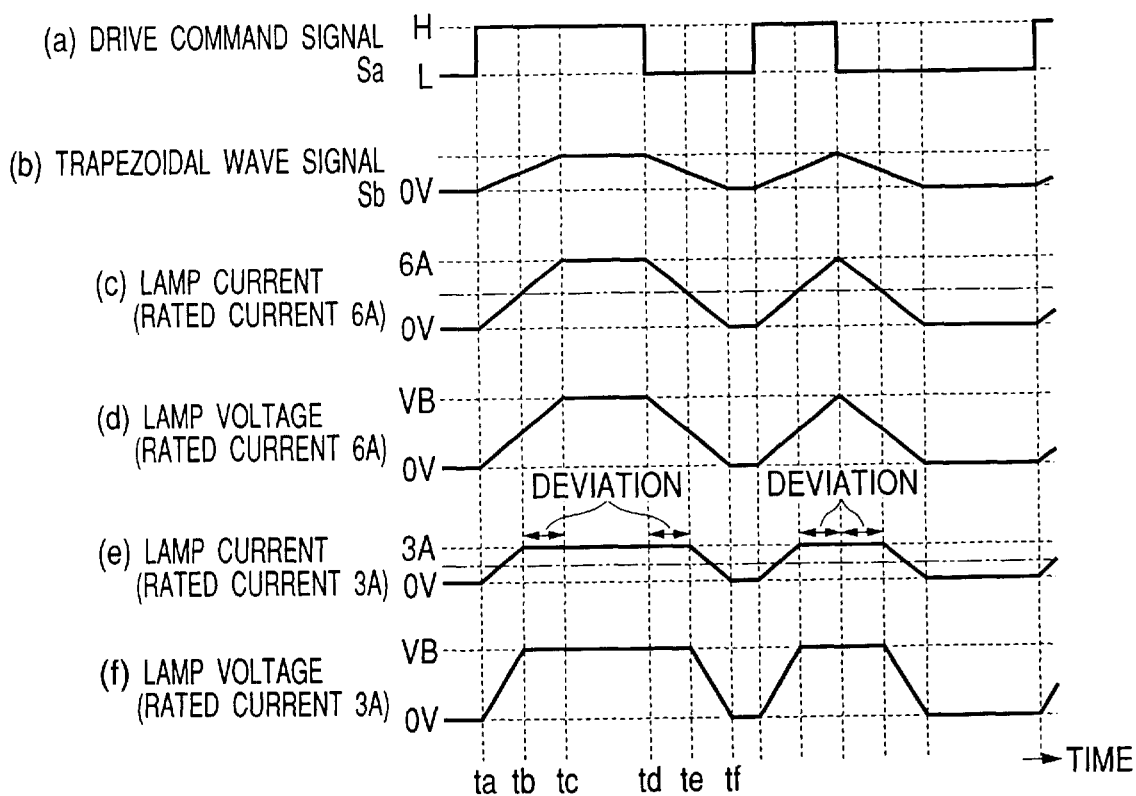
FIG. 6 is a time chart showing the waveforms of various portions in the conventional electric load drive apparatus in the case an electric load is a lamp having a rated current of 3A or 6A.

FIG. 20 shows the waveforms of various portions in the conventional electric load drive circuit 1 shown in FIG. 5. The waveforms during a term t1–t4 shown in FIG. 20 are identical with the waveforms during a term t11–t14 shown in FIG. 19.

After time t5, the voltage Vn2 decreases from the boost voltage Vcp in accordance with reduction of trapezoidal wave signal Sb. However, as the conventional electric load drive circuit 1 has no clamp circuit, it takes a relatively long time to lower the voltage Vn2. After a significant time has passed (i.e., at time t6), the load current IL starts decreasing from saturation load current ILm. Due to delay of load current IL, the load current IL abruptly decreases within a short time. This causes large distortion of waveform.

The electric load drive circuit 113 of this embodiment improves the delay of load current IL in the fall stage. When the drive command signal Sa turns into L level from H level, the clamp circuit 323 forcibly decreases the voltage Vn2 of node n2 to a level of Zener voltage Vz defined with respect to the potential VL of load terminal 320. This makes it possible to promptly draw excessive electric charge stored in the gate capacitor of MOS transistor Q113. Hence, the load current IL can quickly follow the reduction of gate potential VG caused by reduction of trapezoidal wave signal Sb. Thus, the stepwise drop of load current IL in the beginning of fall stage can be suppressed to a small one. As a result, the distortion of waveform becomes small. The noise generated at the current supply stop time can be reduced.

In this case, as the Zener voltage Vz is slightly higher than the threshold of MOS transistor Q113, it becomes possible to reduce the time lag from the timing the drive command signal Sa turns into L level from H level to the timing the load current IL start decreasing. The distortion of waveform in the beginning of fall stage of load current IL can be suppressed to a small one.

Furthermore, the clamp circuit 323 limits the voltage Vn2 with respect to the reference voltage of the source of MOS transistor Q113. No adverse influence is given from the voltage VL of load terminal 320. It becomes possible to surely limit the gate potential Vg of MOS transistor Q113 to the decreasing start level.

As apparent from the foregoing description, the fourth embodiment of the present invention provides an electric load drive apparatus comprising:

a transistor (Q113) provided in a current path extending from a direct-current power source (317) to an electric load (312) for controlling a load current (IL) flowing across the electric load (312) based on a control signal;

a current detecting section (R113) for detecting the load current (IL) flowing across the electric load (312);

a signal generating section (321) for generating a current command signal (Sb) in accordance with a drive command signal (Sa) entered from an external device, the current command signal (Sa) having a trapezoidal waveform increasing from a first level to a second level in response to a drive start command (Sa-H) and decreasing from the second level to the first level in response to a drive stop command (Sa-L);

a current control section (322) for supplying the control signal based on a comparison between a current detection signal detected by the current detecting section (R113) and the current command signal (Sb) in such a manner that a trapezoidal current flows across the electric load (312) in accordance with the current command signal (312); and a control voltage limit section (323) for limiting the control signal to a decreasing start level (Vz) in response to the drive stop command (Sa-L), the decreasing start level (Vz) being slightly higher than a threshold level (Vt) of the transistor (Q113) required to reduce the current flowing across the electric load (312).

The control voltage limit section (323) limits the control signal to the decreasing start level (Vz) defined with respect to a source or emitter potential of the transistor (Q113) in response to the drive stop command (Sa-L).

The current control section (322) comprises an error amplifying section (334) for outputting the control signal corresponding to a difference between the current detection signal and the current command signal (Sb), and the control voltage limit section (323) is connected between an output terminal of the error amplifying section (334) and a source or emitter terminal of the transistor (Q113).

The control voltage limit section (323) is connected between gate and source terminals of the transistor (Q113) or between base and emitter terminals of the transistor (Q113).

The control voltage limit section (323) is constituted by a serial circuit of a switch circuit (Q173) turning on in response to the drive stop command (Sa-L) and a voltage limit circuit (D113) having a clamp voltage equivalent to the decreasing start level (Vz).

The voltage limit circuit is a Zener diode (D113).

This embodiment of the present invention is not limited to the disclosed one. Accordingly, this embodiment can be modified in the following manner.

For example, MOS transistor Q113 can be interposed between the electric load 312 and the ground line so that MOS transistor Q113 can function as a low side switch. Furthermore, it is possible to use a bipolar transistor or IGBT for switching element.

The voltage limit circuit in clamp circuit 323 is not limited to Zener diode D113 and therefore can be replaced by any other constant-voltage circuit.

It is possible to interpose the clamp circuit 323 between the gate and source terminals of MOS transistor Q113.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An electric load drive apparatus comprising:
   a switching element provided in an electric power supply path extending from a direct-current power source to an electric load;
   a detecting resistor, connected in series with said switching element, for detecting a voltage value representing a load current flowing across said electric load via said switching element;
   a saturation state detecting section for outputting a current saturation signal during a term an upper limit current flows across said electric load, said upper limit current being a maximum current flowable via said switching element in an open/close controllable range of said switching element;
   a signal generating section for producing a trapezoidal wave signal whose voltage value starts changing in accordance with increase of said load current when a drive start command signal is entered, stops changing in response to the output of said current saturation signal generated from said saturation state detecting section, and then starts changing in accordance with decrease of said load current when a drive stop command signal is entered, and
   a current control section for comparing said trapezoidal wave signal produced from said signal generating section with said voltage value detected by said detecting resistor and then controlling said switching element based on said trapezoidal wave signal in such a manner a trapezoidal wave current flows across said electric load.

2. The electric load drive apparatus in accordance with claim 1, wherein
   said switching element is constituted by a transistor capable of controlling said load current in accordance with an input voltage entered to a control terminal thereof,
   said current control section comprises an operational amplifier outputting a voltage corresponding to a potential difference between said trapezoidal wave signal produced from said signal generating section and said voltage value detected by said detecting resistor, and
   said current control section controls said input voltage supplied to said control terminal of said transistor in accordance with the output voltage of said operational amplifier.

3. The electric load drive apparatus in accordance with claim 2, wherein said saturation state detecting section comprises a comparator comparing a control voltage of said transistor with a predetermined reference voltage.

4. The electric load drive apparatus in accordance with claim 1, wherein said signal generating section comprises
   a capacitor outputting said trapezoidal wave signal,
   a first constant-current circuit connected in series with said capacitor,
   a second constant-current circuit connected in parallel with said capacitor to perform a constant-current operation during a term said drive stop command signal is entered, and
   a third constant-current circuit connected in series with said first constant-current circuit to input an output current of said first constant-current circuit during a term said saturation state detecting section outputs said current saturation signal.

5. The electric load drive apparatus in accordance with claim 4, wherein said signal generating section comprises a limit circuit for suppressing a voltage applied to said capacitor within a predetermined voltage.

6. The electric load drive apparatus in accordance with claim 1, wherein each of said drive start command signal and said drive stop command signal is a PWM signal having a duty ratio corresponding to said load current.

7. A control apparatus for a power MOS transistor comprising:
   a power MOS transistor interposed between an electric load and a power source for causing a trapezoidal pulse current to flow across said electric load when a control voltage is applied to a gate terminal of said power MOS transistor;
   a gate-source voltage detecting section for detecting a gate-source voltage of said power MOS transistor when said control voltage is applied to the gate terminal of said power MOS transistor;
   a feedback section for obtaining deviations of rise time and fall time of a present load current waveform with respect to their target values based on the gate-source voltage of said power MOS transistor detected by said gate-source voltage detecting section, and for performing feedback control of said power MOS transistor so as to eliminate said deviations of rise time and fall time.

8. The control apparatus for a power MOS transistor in accordance with claim 7, wherein said rise time and said fall time of the present load current waveform are obtained by measuring the duration of a saturation region in the transistor characteristics.

9. The control apparatus for a power MOS transistor in accordance with claim 8, further comprising:
   a first comparing section for comparing the detected gate-source voltage with a first judgement value being set between an OFF voltage and a threshold voltage;
   a second comparing section for comparing the detected gate-source voltage with a second judgement value being set between an ON voltage and the threshold voltage; and
   a time measuring section for measuring elapse of time between said first judgement value and said second judgement value based on comparing results obtained by said first comparing section and said second comparing section and designating the measured time elapse as said duration of said saturation region in the transistor characteristics.

10. The control apparatus for a power MOS transistor in accordance with claim 7, wherein the feedback control of said power MOS transistor is performed in such a manner that the rise time and the fall time become constant.

11. The control apparatus for a power MOS transistor in accordance with claim 7, wherein said electric load is a lamp.

12. An electric load drive apparatus comprising:
   a signal generating section for generating a current command signal in accordance with a drive command signal entered from an external device, said current command signal having a trapezoidal waveform increasing from a first level to a second level in response to a drive start command and decreasing from the second level to the first level in response to a drive stop command;
   a current drive section, provided in a current supply path extending from a direct-current power source to an electric load, for detecting a load current flowing across said electric load and outputting a trapezoidal current to said electric load based on a comparison between the detected load current and said current command signal;
   a measuring section for measuring a rise time of said load current corresponding to increase of said current command signal and a fall time of said load current corresponding to decrease of said current command signal; and
   a gradient control section for controlling a change rate of said current command signal produced from said signal generating section in such a manner that the measured rise time is equalized with a predetermined reference rise time and the measured fall time is equalized with a predetermined reference fall time.

13. The electric load drive apparatus in accordance with claim 12, wherein said gradient control section comprises a gradient limit section for preventing the change rate of said current command signal from exceeding a predetermined regulation value.

14. The electric load drive apparatus in accordance with claim 12, wherein said measuring section comprises:
   a voltage detecting section for detecting a load voltage applied on said electric load when said current command signal is in said second level;
   a reference voltage generating section for generating a first reference voltage and a second reference voltage having mutually different ratios with respect to the detected load voltage of said voltage detecting section; and
   a time measuring section for measuring a time required for said load voltage applied on said electric load to vary from said first reference voltage to said second reference voltage or vice versa.

15. The electric load drive apparatus in accordance with claim 12, wherein said signal generating section comprises:
   a capacitor for outputting said current command signal;
   a first current output circuit, having a controllable output current, for supplying a charge current of said capacitor; and
   a second current output circuit, having a controllable output current, for supplying a discharge current of said capacitor.

16. The electric load drive apparatus in accordance with claim 15, wherein said gradient control section comprises:
   a first current control section for controlling the output current of said first current output circuit based on a difference between the rise time measured by said measuring section and said reference rise time; and
   a second current control section for controlling the output current of said second current output circuit based on a difference between the fall time measured by said measuring section and said reference fall time.

17. The electric load drive apparatus in accordance with claim 16, wherein each of said first and second current output circuits produces a current in accordance with an entered control voltage, and
   each of said first and second current control sections comprises:
      a capacitor for outputting said control voltage;
      a charge circuit for charging said capacitor when said difference is positive; and
      a discharge circuit for discharging said capacitor when said difference is negative.

18. The electric load drive apparatus in accordance with claim 12, wherein said current drive section comprises:
   a switching element provided in a current supply path extending from said direct-current power source to said electric load;

a current detecting section for detecting said load current and producing a current detecting signal; and a load current control section for controlling said switching element based on a difference between said current detecting signal and said current command signal.

19. The electric load drive apparatus in accordance with claim 12, wherein said drive command signal is a cyclic pulse signal having a controlled duty ratio.

20. An electric load drive apparatus comprising:

a transistor provided in a current path extending from a direct-current power source to an electric load for controlling a load current flowing across said electric load based on a control signal;

a current detecting section for detecting the load current flowing across said electric load;

a signal generating section for generating a current command signal in accordance with a drive command signal entered from an external device, said current command signal having a trapezoidal waveform increasing from a first level to a second level in response to a drive start command and decreasing from the second level to the first level in response to a drive stop command;

a current control section for supplying said control signal based on a comparison between a current detection signal detected by said current detecting section and said current command signal in such a manner that a trapezoidal current flows across said electric load in accordance with said current command signal; and a control voltage limit section for limiting said control signal to a decreasing start level in response to said drive stop command, said decreasing start level being slightly higher than a threshold level of said transistor required to reduce the current flowing across said electric load.

21. The electric load drive apparatus in accordance with claim 20, wherein said control voltage limit section limits said control signal to said decreasing start level defined with respect to a source or emitter potential of said transistor in response to said drive stop command.

22. The electric load drive apparatus in accordance with claim 21, wherein said current control section comprises an error amplifying section for outputting the control signal corresponding to a difference between said current detection signal and said current command signal, and said control voltage limit section is connected between an output terminal of said error amplifying section and a source or emitter terminal of said transistor.

23. The electric load drive apparatus in accordance with claim 21, wherein said control voltage limit section is connected between gate and source terminals of said transistor or between base and emitter terminals of said transistor.

24. The electric load drive apparatus in accordance with claim 20, wherein said control voltage limit section is constituted by a serial circuit of a switch circuit turning on in response to said drive stop command and a voltage limit circuit having a clamp voltage equivalent to said decreasing start level.

25. The electric load drive apparatus in accordance with claim 24, wherein said voltage limit circuit is a Zener diode.

* * * * *